(12) United States Patent
Choi et al.

(10) Patent No.: US 8,109,754 B2
(45) Date of Patent: Feb. 7, 2012

(54) METHOD AND SYSTEM FOR DOUBLE-SIDED PATTERNING OF SUBSTRATES

(75) Inventors: Byung-Jin Choi, Austin, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/686,732

(22) Filed: Jan. 13, 2010

(65) Prior Publication Data
US 2010/0129486 A1    May 27, 2010

Related U.S. Application Data

(63) Continuation of application No. 11/565,350, filed on Nov. 30, 2006, now Pat. No. 7,670,529.

(51) Int. Cl.
*B29C 59/00* (2006.01)
(52) U.S. Cl. .......... 425/385; 264/293; 425/150
(58) Field of Classification Search .......... 425/385, 425/149, 150; 264/293
See application file for complete search history.

(56) References Cited

U.S. PATENT DOCUMENTS

| | | | |
|---|---|---|---|
| 6,517,995 B1 * | 2/2003 | Jacobson et al. | 430/320 |
| 2005/0156342 A1 * | 7/2005 | Harper et al. | 264/40.1 |
| 2005/0172848 A1 * | 8/2005 | Olsson | 101/493 |

* cited by examiner

*Primary Examiner* — Maria Veronica Ewald
(74) *Attorney, Agent, or Firm* — Cameron A. King

(57) ABSTRACT

A system of patterning first and second opposed sides of a substrate is described. The system may employ a mold assembly and obtaining a desired spatial relationship between the first and second opposed sides of the substrate and the mold assembly. In a further embodiment, the method and system may employ a first and a second mold assembly.

8 Claims, 28 Drawing Sheets

METHOD AND SYSTEM FOR DOUBLE-SIDED PATTERNING OF SUBSTRATES

CROSS-REFERENCE TO RELATED APPLICATIONS

The present application is a continuation of U.S. Ser. No. 11/565,350 filed Nov. 30, 2006, which is incorporated herein by reference in its entirety. U.S. Ser. No. 11/565,350 claims priority to U.S. Provisional Application No. 60/748,430, filed on Dec. 8, 2005, which is incorporated herein by reference in its entirety.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as U.S. patent application publication 2004/0065976 filed as U.S. patent application Ser. No. 10/264,960, entitled, "Method and a Mold to Arrange Features on a Substrate to Replicate Features having Minimal Dimensional Variability"; U.S. patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The imprint lithography technique disclosed in each of the aforementioned U.S. patent application publications and U.S. patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

In some applications, it may be desirable to form a relief pattern on first and second opposed sides of the substrate. Forming a pattern on first and second opposed sides of the substrate, i.e. double-sided patterning, may be beneficial in the area of patterned media imprinting. To that end, a need therefore exists to provide a method and a system of double-sided patterning of substrates.

DETAILED DESCRIPTION

Figure 1:
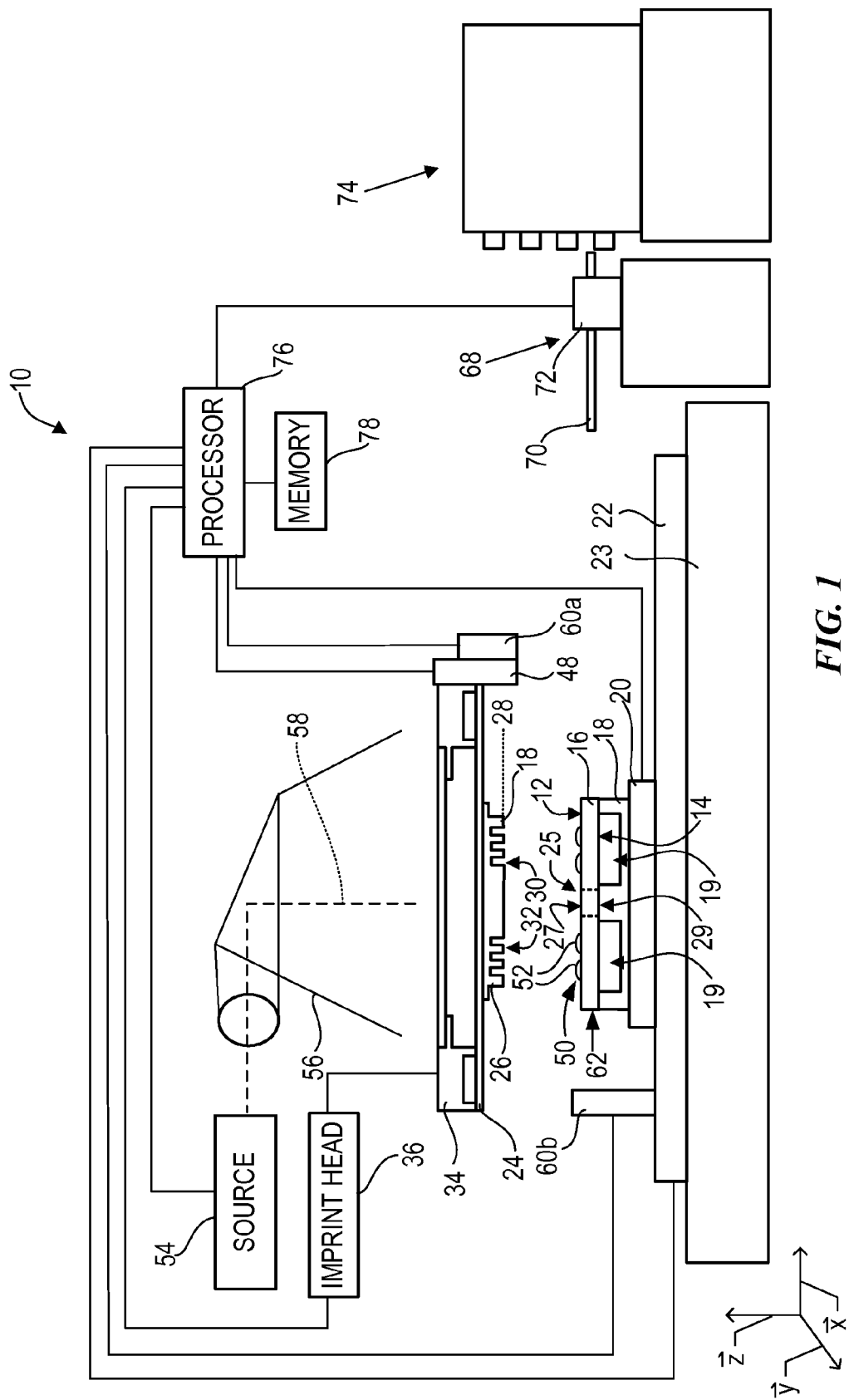
FIG. 1 is a simplified side view of a lithographic system having a template spaced-apart from a substrate, the substrate having first and second opposed sides.

Referring to FIG. 1, a system 10 is shown to form a relief pattern on a first side 12 and a second side 14 of a substrate 16. In an example, substrate 16 may be substantially absent of an alignment mark. Substrate 16 may be coupled to a substrate chuck 18, with substrate chuck 18 being any chuck including, but not limited to, vacuum and electromagnetic. Substrate chuck 18 may further comprise a cavity 19 facing substrate 16. Substrate 16 and substrate chuck 18 may be supported on a first stage 20 and a second stage 22, with first stage 20 being positioned between substrate chuck 18 and second stage 22. Further, first and second stages 20 and 22 may be positioned on a base 23. First stage 20 may provide motion about a first axis while second stage 22 may provide motion about a second axis, the second axis being orthogonal to the first axis, i.e. the first and second axes being the x and y axes. Exemplary stages in the present invention are available under part number XM2000 from Newport Corporation of Irvine, Calif. Substrate 16 further comprises a throughway 25 having an aperture 27 about first side 12 of substrate 16 and an aperture 29 about second side 14 of substrate 16. However, in a further embodiment, substrate 16 may be substantially absent of throughway 25.

Spaced-apart from substrate 16 is a template 24 having a mesa 26 extending therefrom towards substrate 16 with a patterning surface 28 thereon. Mesa 26 may also be referred to as a mold 26. However, in a further embodiment, template 24 may be substantially absent of mold 26. Template 24 and/or mold 26 may be formed from such materials including but not limited to, fused-silica, quartz, silicon, organic polymers, siloxane polymers, borosilicate glass, fluorocarbon polymers, metal, and hardened sapphire. As shown, patterning surface 28 comprises features defined by a plurality of spaced-apart recesses 30 and protrusions 32. However, in a further embodiment, patterning surface 28 may be substantially smooth and/or planar. Patterning surface 28 may define an original pattern that forms the basis of a pattern to be formed on first and second sides 12 and 14 of substrate 16, described further below. Template 24 may be coupled to a template chuck 34, template chuck 34 being any chuck including, but not limited to, vacuum and electromagnetic. Further, template chuck 34 may be coupled to an imprint head 36 to facilitate movement of template 24 and mold 26.

Figure 2:
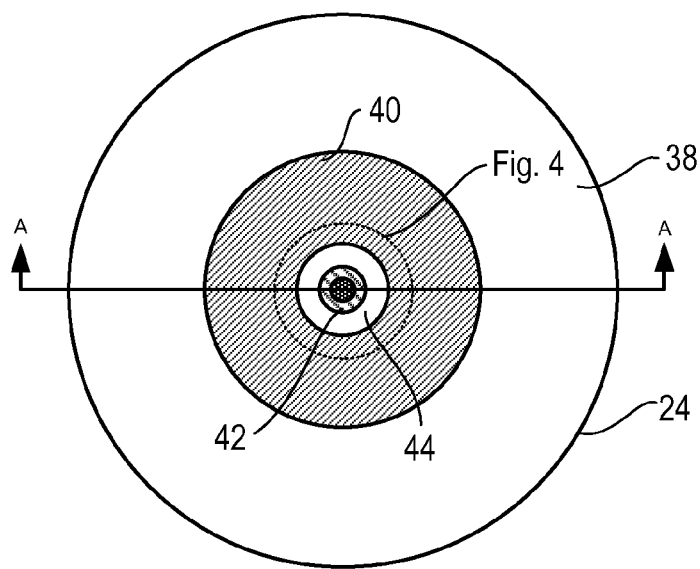
FIG. 2 is a top down view of the template shown in FIG. 1.
Figure 3:
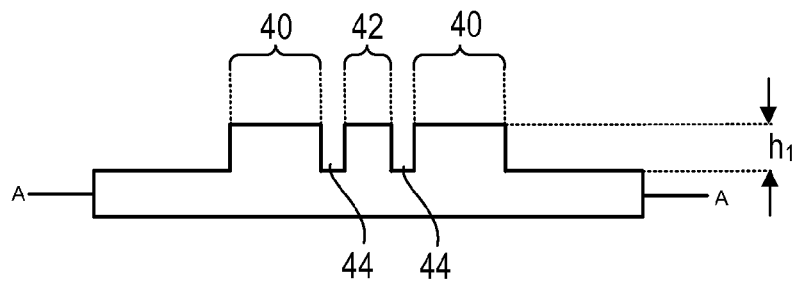
FIG. 3 is a side view of the template shown in FIG. 1.

Referring to FIGS. 2 and 3, a top down view of template 24 is illustrated. As shown, template 24 comprises a circular shape. However, in a further embodiment, template 24 may comprise any geometric shape desired. Further, template 24 may comprise a first region 38, a second region 40, and a third region 42, with the second region 40 being positioned between first region 38 and third region 40. Second region 40 may be referred to as an active region 40. Furthermore, as shown, third region 42 may be positioned at a center of template 24; however, in a further embodiment, third region 42 may be positioned at any location of template 24 desired. Mold 26, shown in FIG. 1, may be in superimposition with active region 40. Active region 40 and third region 42 may have a height $h_1$. In an example, height $h_1$ may be in the range of 5-15 microns. In a further embodiment, the height of active region 40 and third region 42 may differ. Furthermore, there may be a recession 44 positioned between active region 40 and third region 42.

Figure 4:
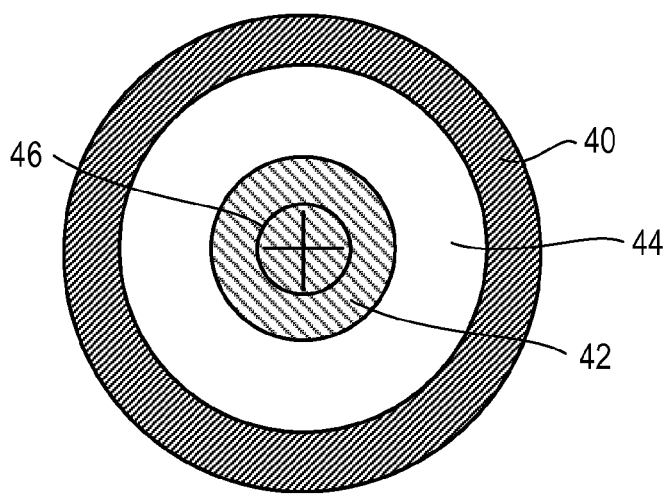
FIG. 4 is an exploded view of a portion of FIG. 2, the template having an alignment mark.

Referring to FIGS. 2 and 4, third region 42 may comprise an alignment mark 46. In an example, alignment mark 46 may be a standard universal alignment target (UAT). Alignment mark 46 may be employed to obtain a desired spatial relationship between template 24 and substrate 16, shown in FIG. 1.

Referring to FIG. 1, system 10 further comprises a fluid dispenser 48. Fluid dispenser 48 may be in fluid communication with substrate 16 so as to position a polymeric material 50 on substrate 16, described further below. As shown, fluid dispenser 48 is coupled to template chuck 34; however, in a further embodiment, fluid dispenser 48 may be coupled to any part of system 10, i.e., template 24 or imprint head 36. Further, system 10 may comprise any number of fluid dispensers and fluid dispenser 48 may comprise a plurality of dispensing units therein. Polymeric material 50 may be positioned on substrate 16 using any known technique, e.g., drop dispense, spin-coating, dip coating, thin film deposition, thick film deposition, and the like. As shown, polymeric material 50 may be positioned upon substrate 16 as a plurality of spaced-apart droplets 52.

System 10 further comprises a source 54 of energy 56 coupled to direct energy 56 along a path 58. In an example, source 54 may be an ultraviolet emitting lamp coupled with either a liquid guide or an ultraviolet fiber guide. An exemplary source of energy in the present invention is available under part number BlueWave™ 200 Spot Lamp from DYMAX Corporation of Torrington, Conn. Imprint head 36 and first and second stages 20 and 22 are configured to arrange mold 26 and substrate 16, respectively, to be in superimposition and disposed within path 58. Either imprint head 36, first and second stages 20 and 22, or a combination of the above, may vary a distance between mold 26 and substrate 16 to define a desired volume therebetween that is filled by polymeric material 50, described further below.

System 10 further comprises an optical detection system having imaging units 60a and 60b. As shown, imaging unit 60a may be coupled to fluid dispenser 48; however, in a further embodiment, imaging unit 60a may be coupled to any part of system 10, i.e., template 24, template chuck 34, or imprint head 36. Furthermore, as shown, imaging unit 60b is coupled to second stage 22; however, in a further embodiment, imaging unit 60b may be coupled to any part of system 10, i.e., substrate chuck 18 or first stage 20. Further, system 10 may comprise any number of imaging units 60a and 60b. Imaging units 60a and 60b may be a microscope in data communication with an image processing module (not shown). In a further embodiment, imaging units 60a and 60b may be a laser edge detecting sensor.

Figure 5:
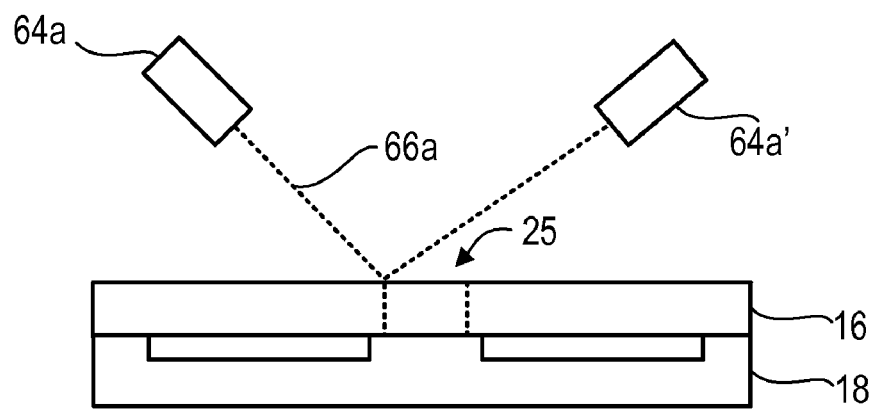
FIG. 5 is a side view of the substrate shown in FIG. 1, and an optical detection system for detecting the substrate.
Figure 6:
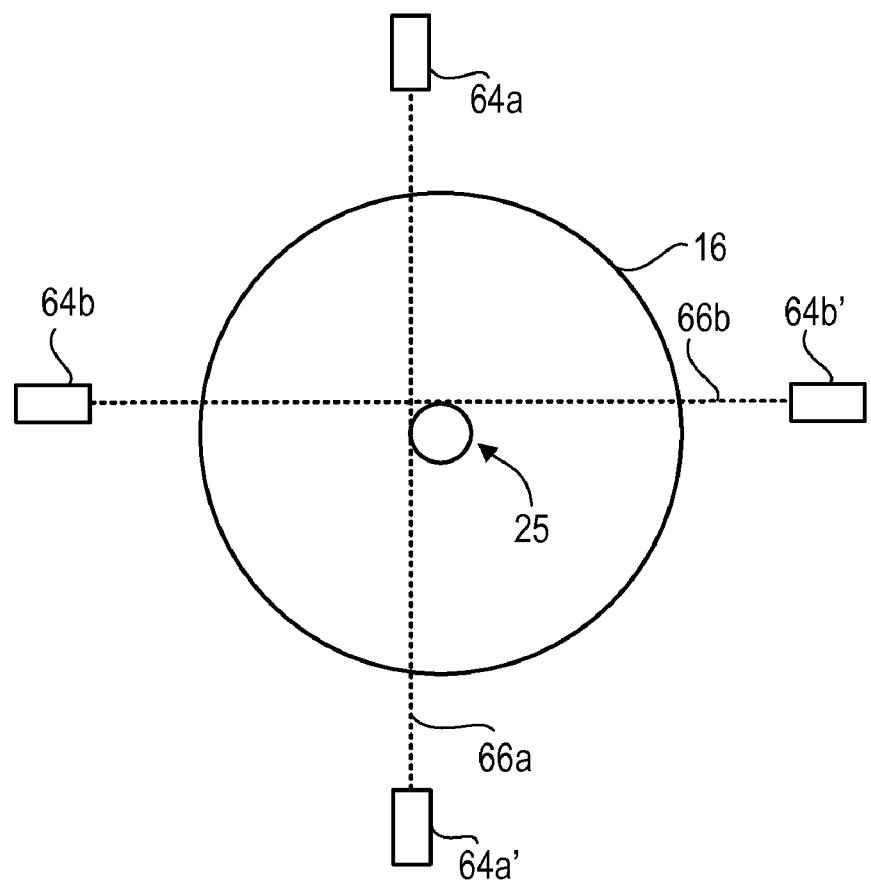
FIG. 6 is a top down view of the substrate shown in FIG. 1, and an optical detection system for detecting the substrate.

Referring to FIGS. 1, 5, and 6, imaging units 60a and 60b may be employed to detect substrate 16 and mold 26, respectively. More specifically, imaging units may detect an edge 62 of substrate 16. In a further embodiment, imaging unit 60a, now shown as imaging units 64a, 64a', 64b, and 64b' in FIGS. 5 and 6, may be employed to determine a center location of substrate 16, i.e. throughway 25 about the x and y axes. More specifically, imaging units 64a and 64b may be lasers producing beams 66a and 66b, respectively, with imaging units 64a' and 64b' being intensity sensors detecting beams 66a and 66b, respectively. As shown, imaging units 64a, 64a', 64b, 64b' may detect aperture 25. Imaging units 64a and 64b may be employed as off-axis or thru-the-template. Exemplary intensity sensors employed in the present invention are available under part number LV-H37 from Keyence, Inc. of Woodcliff Lake, N.J.

Figure 7:
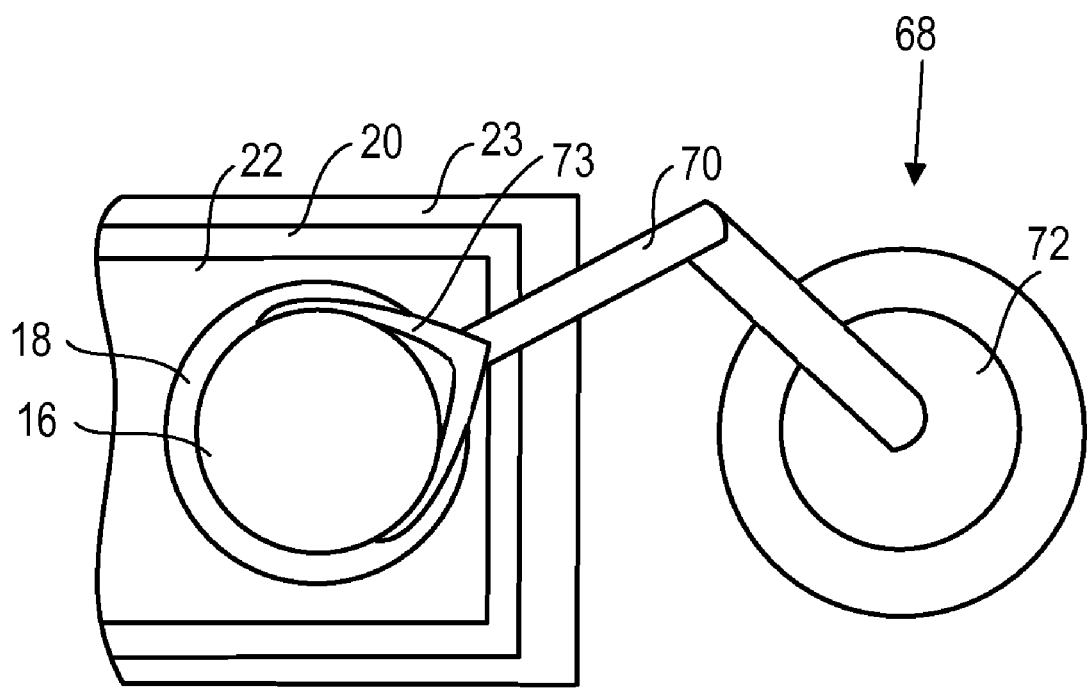
FIG. 7 is a top down view of a robot handling the substrate shown in FIG. 1.

Referring to FIGS. 1 and 7, system 10 further comprises a robot 68 for positioning substrate 16 upon and removing substrate 16 from substrate chuck 18. Robot 68 may be any handling robot known in the art. In an example, robot 68 comprises an arm 70 coupled to a driving means 72. Arm 70 further has an end effecter 73 coupled thereto to handle substrate 16. In an example, end effecter 73 may be an edge-gripping or thin air cavity chuck to hold substrate 16 without contacting an area of substrate 16 having polymeric material 50 positioned thereon, i.e. the active area of substrate 16. Driving means 72 may extend or contract arm 70, rotate arm 70 around its axis, move arm 70 horizontally in a circle, or provide any desired motion of arm 70. Driving means 72 may provide motion about the first and second axes mentioned above. In an example, driving means 72 may rotate about the x axes to flip substrate 16, described further below. Driving means 72 may also rotate about its axis. Furthermore, robot 68 may transport substrate 16 between substrate chuck 18 and a substrate cassette 74. Substrate cassette 74 may comprise a plurality of substrates 16 therein.

Referring to FIG. 1, typically, polymeric material 50 may be positioned upon substrate 16 before the desired volume is defined between mold 26 and substrate 16. However, polymeric material 50 may fill the volume after the desired volume has been obtained. After the desired volume is filled with polymeric material 50, source 54 may produce energy 56, e.g., broadband ultraviolet radiation that causes polymeric material 50 to solidify and/or cross-link conforming to a shape of first side 12 of substrate 16 and patterning surface 28 of mold 26. Control of this process is regulated by a processor 76 that is in data communication with first and second stage 20 and 22, imprint head 36, fluid dispenser 48, source 54, imaging units 60a and 60b, and robot 68, operating on a computer readable program stored in memory 78.

As mentioned above, system 10 may be employed to form a pattern on first side 12 of substrate 16. However, it may be desired to form a pattern on second side 14 of substrate 16 such that both first and second sides 12 and 14 of substrate 16 have patterns formed thereon. To that end, described below are a system and a method of forming a pattern on first and second sides 12 and 14 of substrate 16.

Figure 8:
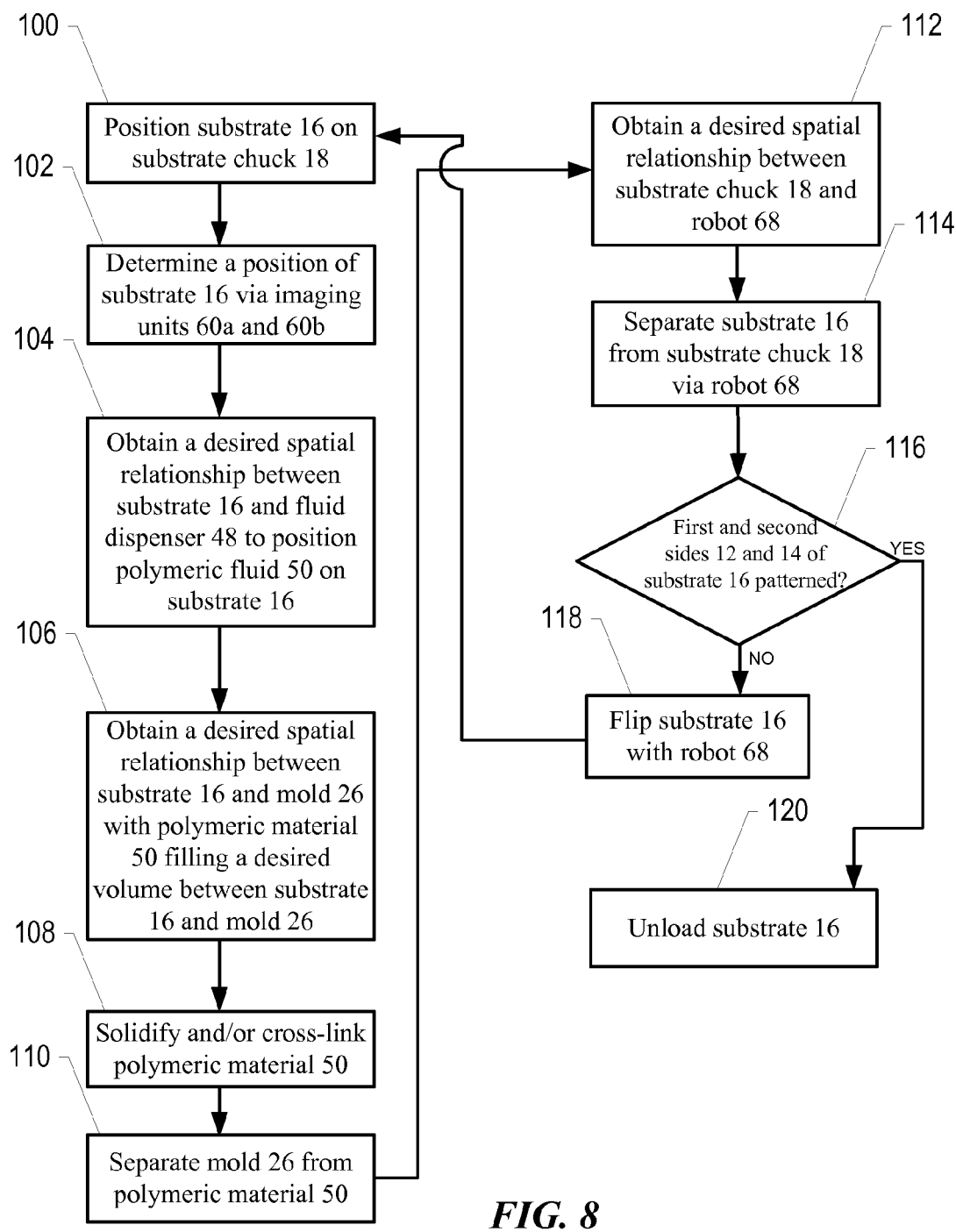
FIG. 8 is a flow diagram showing a method of patterning the first and second opposed sides of the substrate shown in FIG. 1, in a first embodiment.
Figure 9:
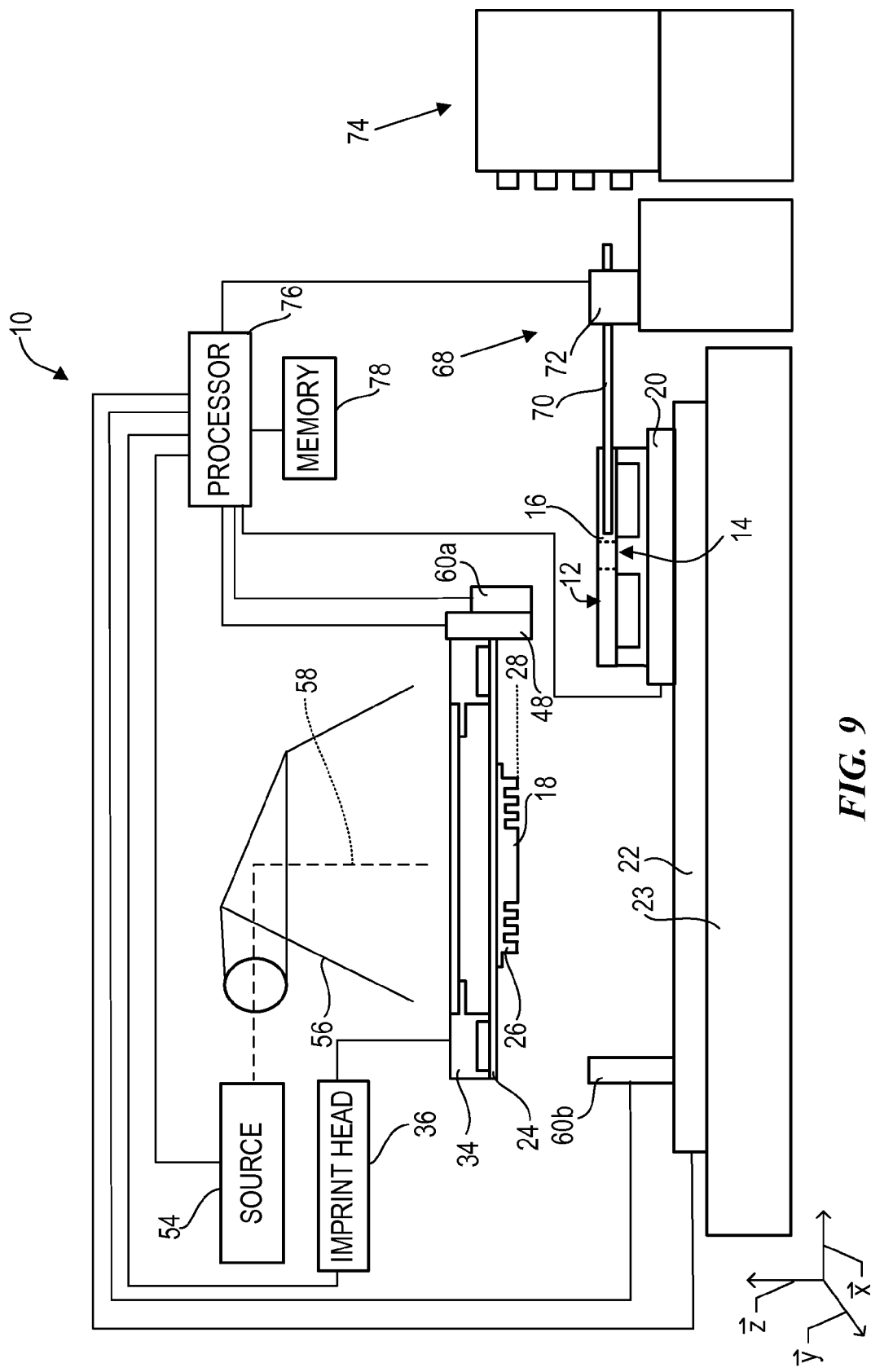
FIG. 9 is a side view of the system shown in FIG. 1, with a robot positioning the substrate on a substrate chuck in a first position.

Referring to FIGS. 8 and 9, in a first embodiment, a method and a system of forming a pattern on first and second sides 12 and 14 of substrate 16 are shown. As mentioned, above, at step 100, substrate 16 may be positioned upon substrate chuck 18. More specifically, first and second stages 20 and 22 may position substrate chuck 18 proximate to robot 68 such that robot 68 may position substrate 16 upon substrate chuck 18. Robot 68 may transfer substrate 16 from substrate cassette 74 and position substrate 16 on substrate chuck 18 such that a side of first and second sides 12 and 14 may be positioned opposite to that of substrate chuck 18. In a first example, robot 68 may position substrate 16 such that first side 12 faces away from substrate chuck 18 while second side 14 faces towards substrate chuck 18. In a second example, robot 68 may position substrate 16 such that second side 14 faces away from substrate chuck 18 while first side 12 faces towards substrate chuck 18. At step 102, imaging unit 60a may determine a position of substrate 16. More specifically, imaging unit 60a may be employed to determine a center location of substrate 16, as mentioned above with respect to FIGS. 5 and 6, with respect to any part of system 10, i.e. mold 18, dispensing unit 48, or robot 68. As a result, a desired spatial relationship of substrate 16 with respect to any part of system 10 may be obtained.

Figure 10:
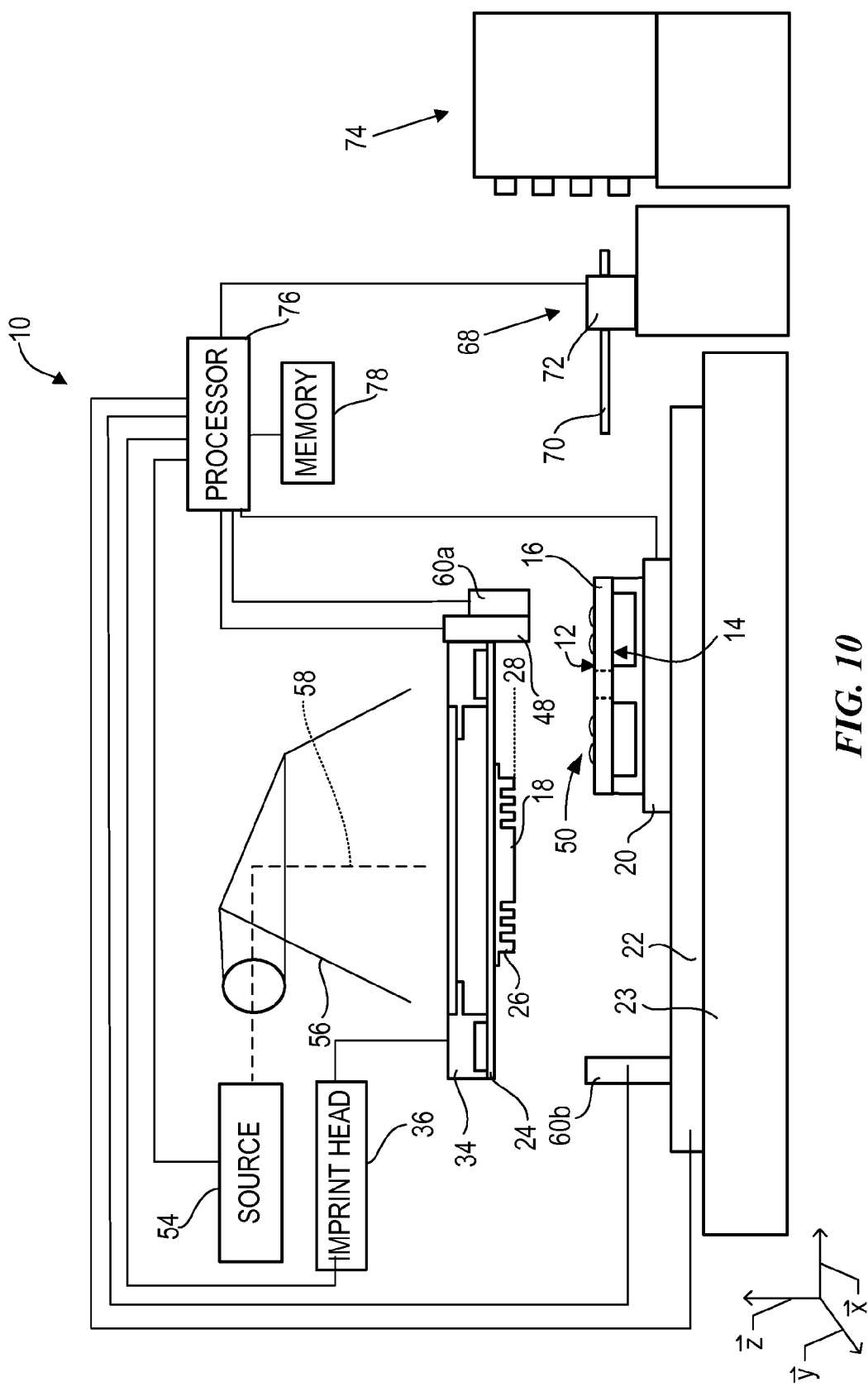
FIG. 10 is a side view of the system shown in FIG. 9, with the substrate having a material positioned on a first side thereof.

Referring to FIGS. 8 and 10, at step 104, first and second stages 20 and 22 may translate substrate 16 such that a desired position may be obtained between substrate 16 and fluid dispenser 48. As a result, fluid dispenser 48 may position polymeric fluid 50 upon first side 12 of substrate 16, as mentioned above.

Figure 11:
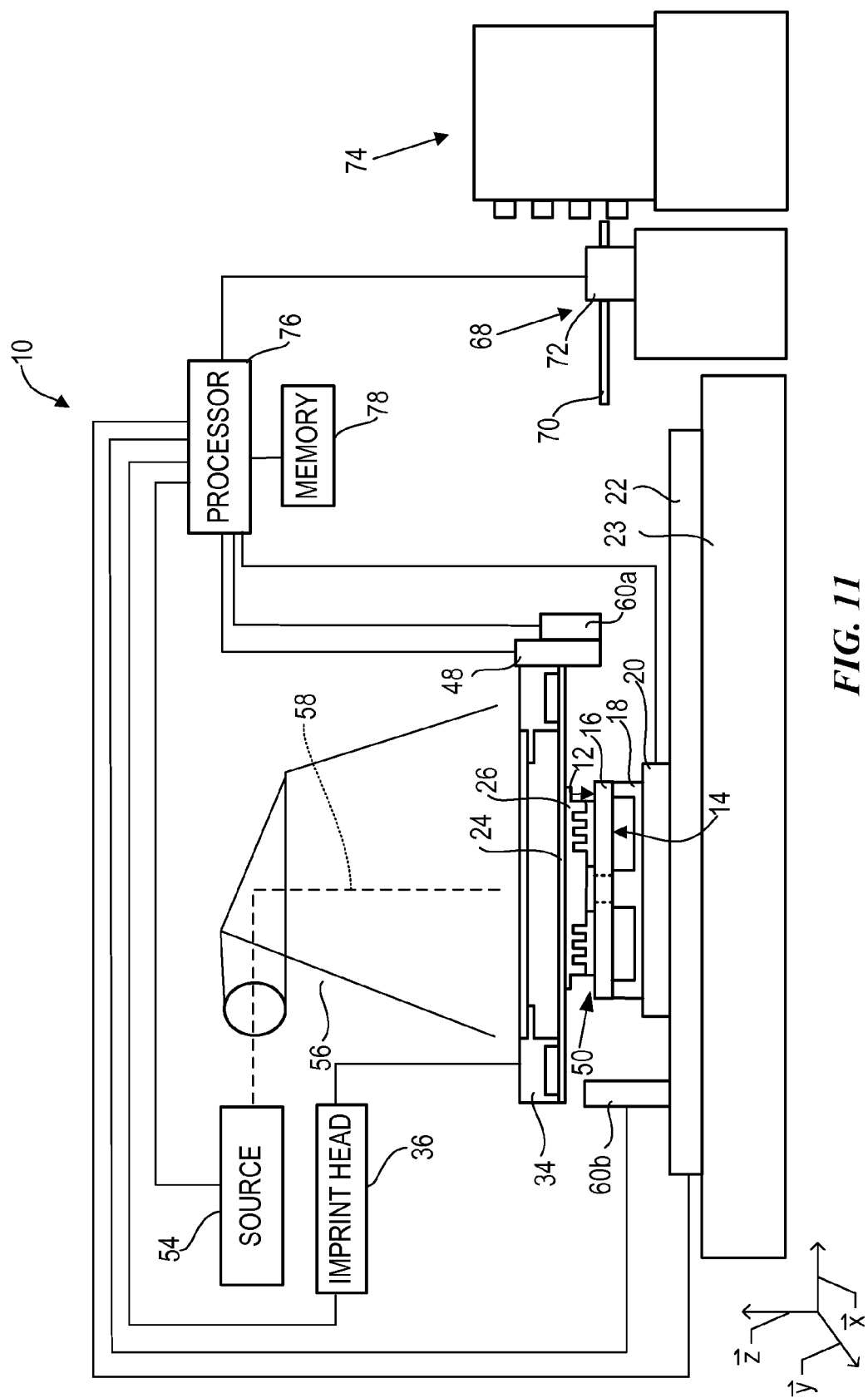
FIG. 11 is a side view of the system shown in FIG. 10, with the template contacting the fluid positioned on the first side of the substrate.

Referring to FIGS. 8 and 11, at step 106, a desired position may be obtained between substrate 16 and mold 26. More specifically, first and second stages 20 and 22 and imprint head 36 may position substrate chuck 18 such that substrate 16 may be in superimposition with mold 26 and further polymeric material 50 fills the desired volume defined between substrate 16 and mold 26. At step 108, as mentioned above, polymeric material 50 positioned on first side 12 of substrate 16 may be solidified and/or cross-linked conforming to first side 12 of substrate 16 and a patterning surface 28 of mold 26. At step 110, mold 18 may be separated from polymeric material 50 positioned on first side 12 of substrate 16.

Figure 12:
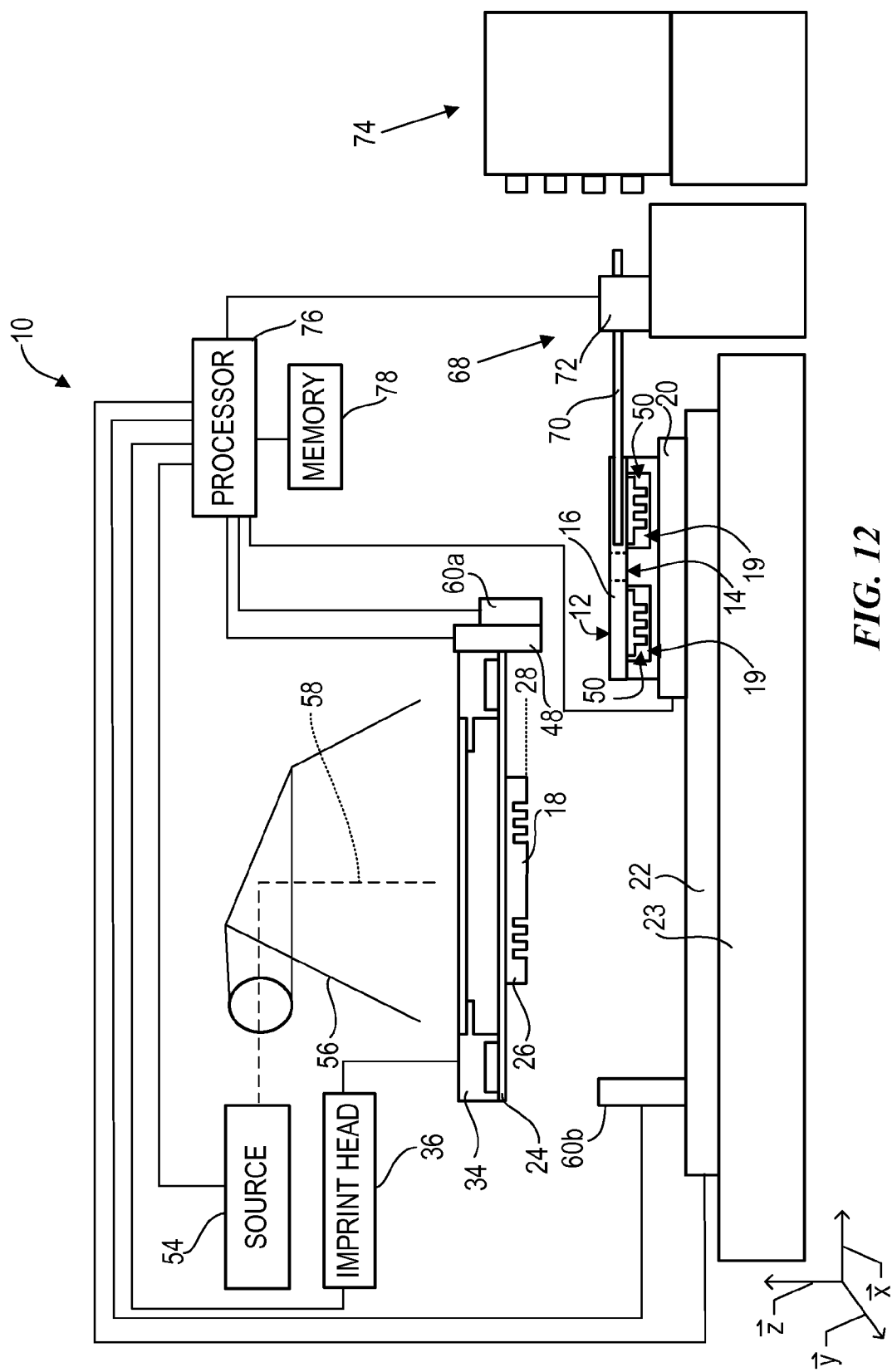
FIG. 12 is a side view of the system shown in FIG. 11, with the robot positioning the substrate on the substrate chuck in a second position.
Figure 13:
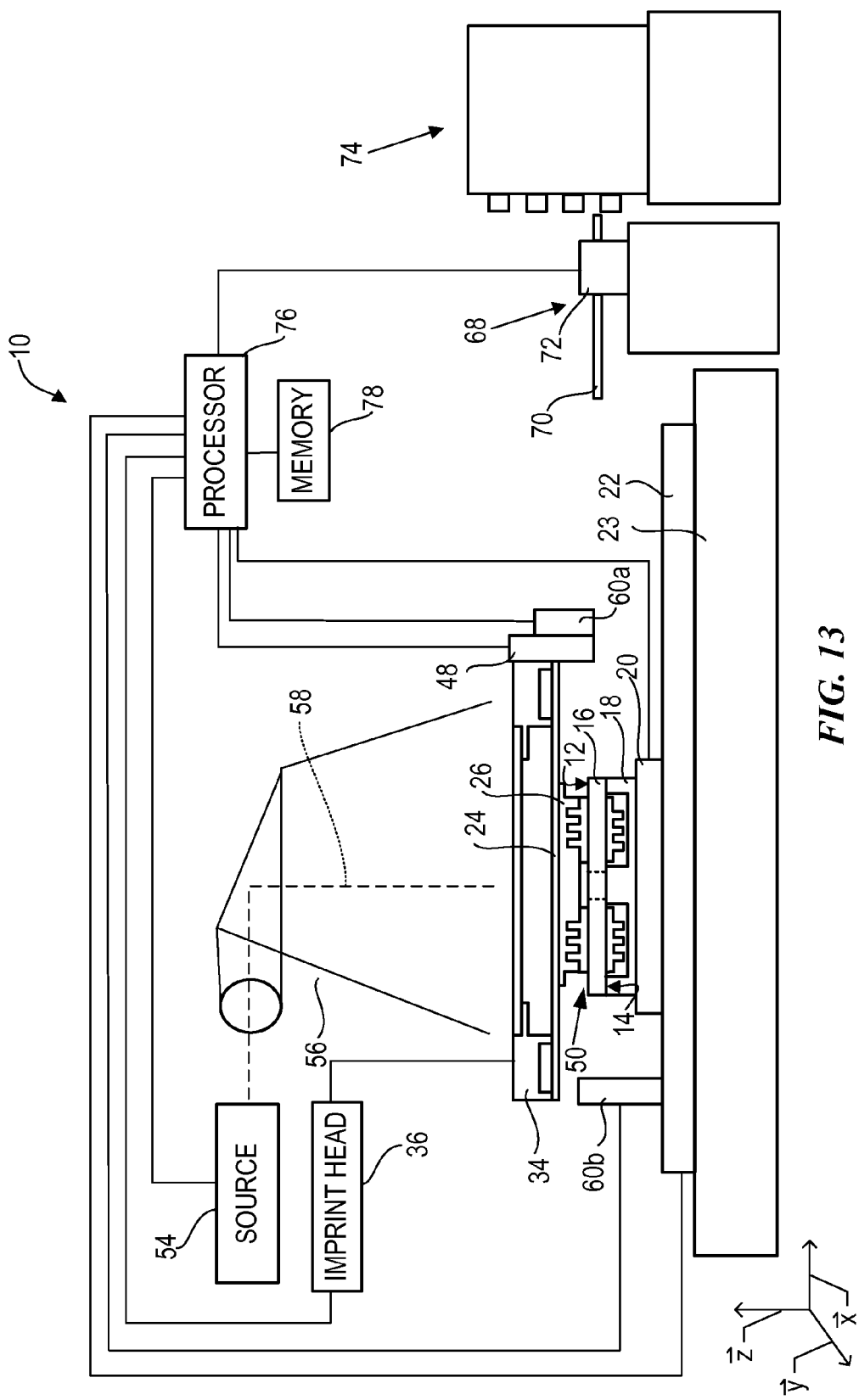
FIG. 13 is a side view of the system shown in FIG. 12, with the template contacting a fluid positioned on the second side of the substrate.

Referring to FIGS. 8 and 12, at step 112, analogous to that mentioned above with respect to step 100, first and second stages 20 and 22 may position substrate chuck 18 proximate to robot 68. At step 114, robot 68 may separate substrate 16 from substrate chuck 18 via robot 68. At step 116, substrate 16 may be analyzed to determine if first and second sides 12 and 14 of substrate 16 are patterned. To that end, at step 118, to that end, were only one side of first and second sides 12 and 14 of substrate 16 patterned, robot 68 may rotate arm 70 around its axis to flip substrate 16 180° with respect to mold 18 and further position substrate 16 on substrate chuck 18 such that the remaining unpatterned side of first and second sides 12 and 14 of substrate 16 may be positioned opposite to that of substrate chuck 18. In a first example, were first side 12 of substrate 16 patterned, robot 68 would position substrate 16 such that first side 12 faces towards substrate chuck 18 and second side 14 faces away from substrate chuck 18. In a second example, were second side 14 of substrate 16 patterned, robot 68 would position substrate 16 such that second side 14 faces towards substrate chuck 18 and first side 12 faces away from substrate chuck 18. Furthermore, polymeric material 50 patterned on a side of first and second sides 12 and 14 of substrate 16 may be positioned within cavity 19 of substrate chuck 18 to minimize, if not prevent, damage to polymeric material 50. To that end, the remaining side of first and second sides 12 and 14 of substrate 16 may be patterned analogous to that mentioned above in FIGS. 8-12, with substrate 16 having first and second sides 12 and 14 patterned shown in FIG. 13.

Referring to FIGS. 1 and 8, however, were both first and second sides 12 and 14 of substrate 16 patterned, at step 120 substrate 16 may be unloaded from substrate chuck 18 and robot 68 may position substrate 16 in substrate cassette 74. In a further embodiment, fluid dispenser 48 may be positioned outside of system 10, with first and second sides 12 and 14 of substrate 16 having polymeric fluid 50 positioned thereon outside of system 10. Furthermore, it may be desired to remove polymeric material 50 from portions of substrate 16 in contact with robot 68 and/or substrate chuck 18.

Figure 14:
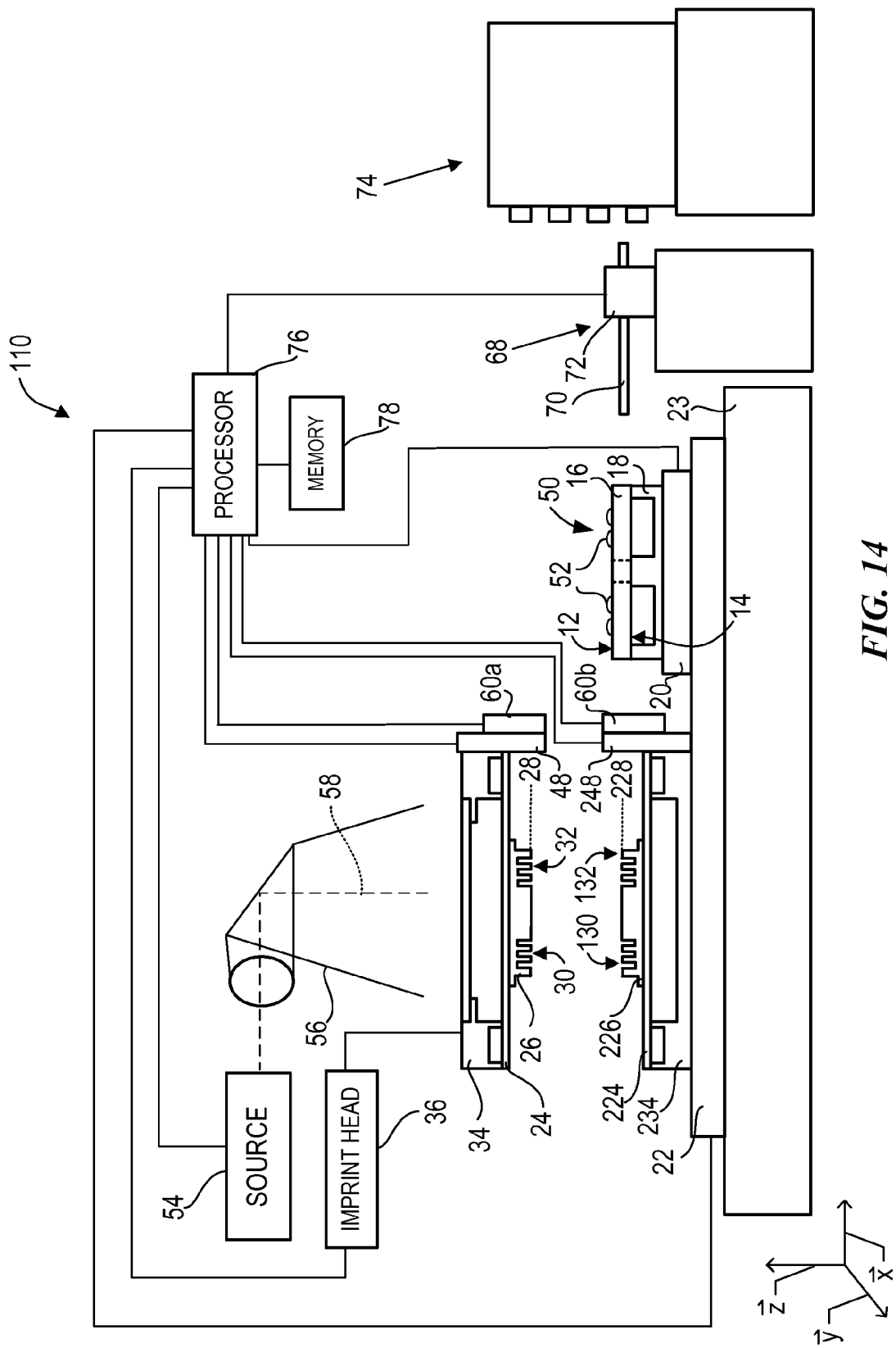
FIG. 14 is a side view of a lithographic system having a first template opposed a second template and a substrate, the substrate having first and second opposed sides, in a further embodiment.

Referring to FIG. 14, a second embodiment of system 10 is described, shown as system 110. System 110 may be analogous to that as system 10 described above with respect to FIGS. 1-7, however, system 110 may further comprise an additional patterning surface, described further below.

To that end, system 110 further comprises a template 224 having a mold 226 extending therefrom towards template 24 with a patterning surface 228 thereon. Template 224 may be coupled to a template chuck 234. Template 224, mold 226, and template chuck 234 may be analogous to that of template 24, mold 26, and template chuck 34, respectively, described above with respect to FIG. 1. Mold 226 may have substantially the same patterning surface 228 as patterning surface 28 of mold 26; however, in a further embodiment, patterning surface 228 may differ from patterning surface 28. Template 224, mold 226, and template chuck 234 may be coupled to second stage 22, with second stage 22 providing motion of template 224, mold 226, and template chuck 234 about the second axis, as mentioned above with respect to FIG. 1. As a result, mold 226 may be positioned in superimposition with mold 26 to facilitate patterning of first and second sides 12 and 14 of substrate 16, described further below. In a further embodiment, template 224, mold 226, and template chuck 234 may be further coupled to first stage 20.

System 110 further comprises a fluid dispenser 248, with fluid dispenser 248 being analogous to fluid dispenser 48 mentioned above with respect to FIG. 1. As shown, fluid dispenser 248 is coupled to template chuck 234; however, in a further embodiment, fluid dispenser 248 may be coupled to any part of system 210; i.e. template 224 or second stage 22. Furthermore, imagining unit 60b is shown coupled to fluid dispenser 248; however, in a further embodiment, imaging unit 60b may be coupled to any part of system 110, i.e., second stage 22, template 224, or template chuck 234. Control of fluid dispenser 248 may be regulated by processor 76 that is in data communication with fluid dispenser 248.

Figure 15:
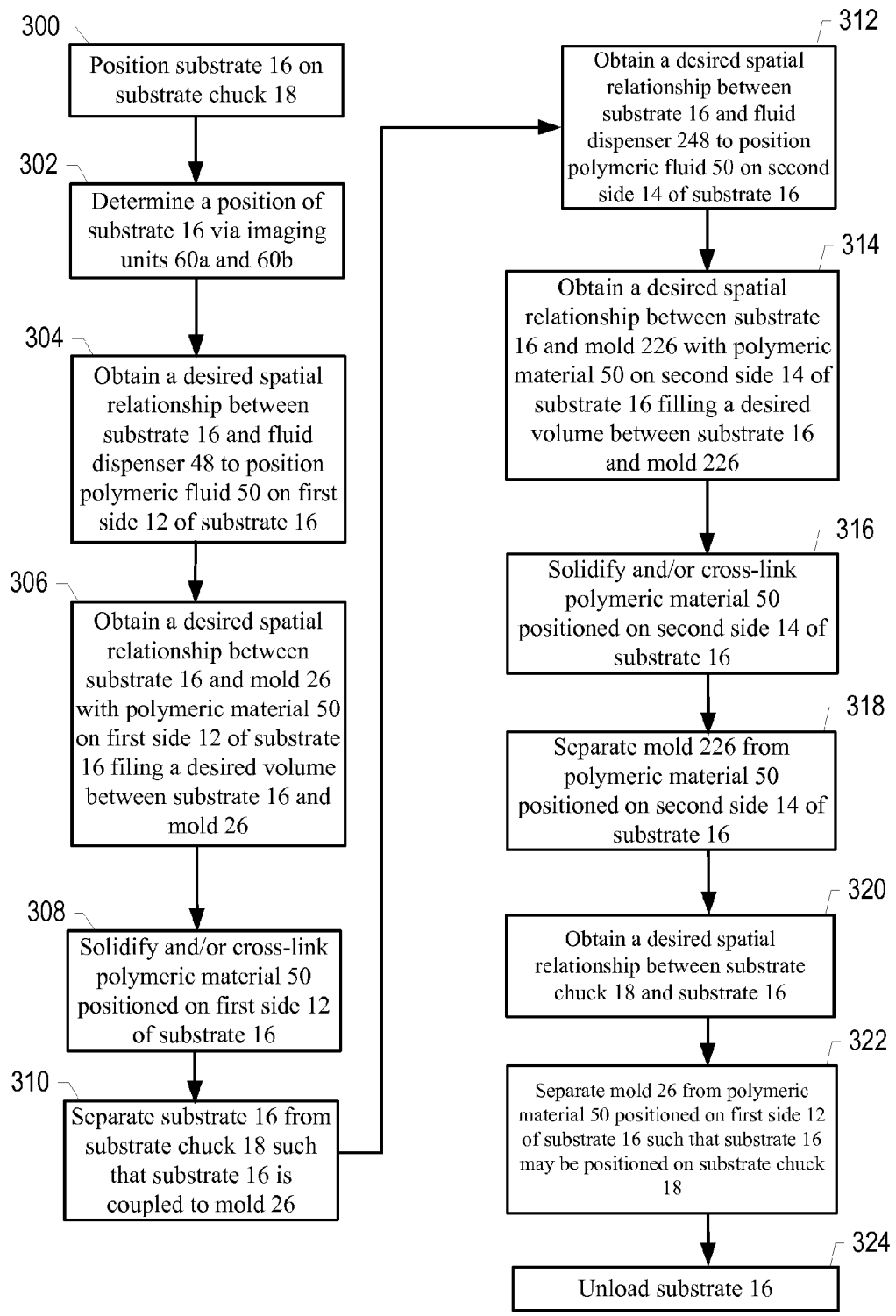
FIG. 15 is a flow diagram showing a method of patterning the first and second opposed sides of the substrate shown in FIG. 14, in a further embodiment.
Figure 16:
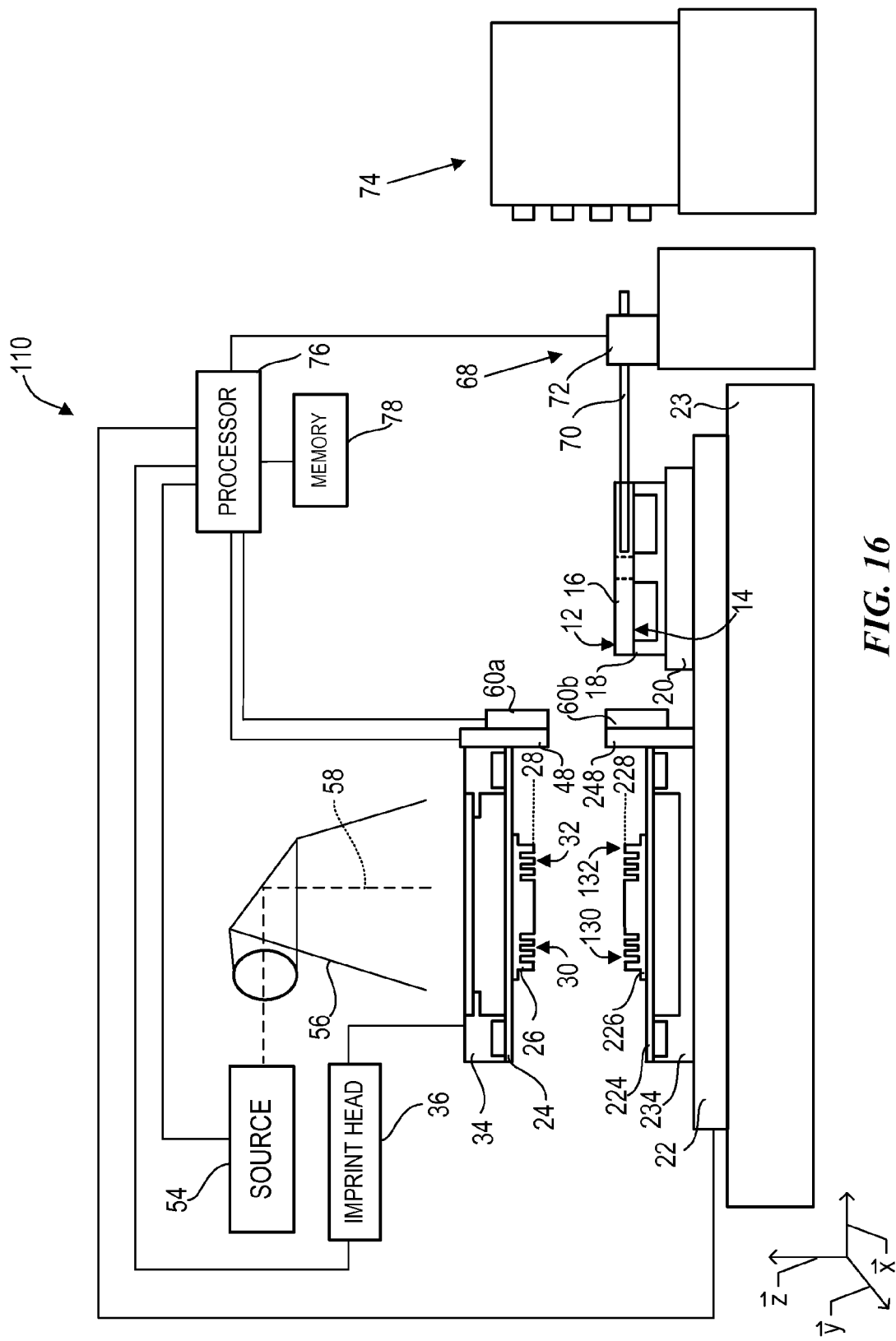
FIG. 16 is a side view of the system shown in FIG. 14, with a robot positioning the substrate on a substrate chuck in a first position.

Referring to FIGS. 15 and 16, a second embodiment of a method and a system of forming a pattern on first and second sides 12 and 14 of substrate 16 are shown. As mentioned above, at step 300, substrate 16 may be positioned upon substrate chuck 18. More specifically, first and second stages 20 and 22 may position substrate chuck 18 proximate to robot 68 such that robot 68 may position substrate 16 upon substrate chuck 18. Robot 68 may transfer substrate 16 from substrate cassette 74 and position substrate 16 on substrate chuck 18 such that a side of first and second sides 12 and 14 may be positioned opposite to that of substrate 18. Please note for simplicity of illustration, coupling between processor 76 and first stage 20, imaging unit 60b, and fluid dispenser 248 is not shown.

At step 302, imaging units 60a and 60b may determine a position of substrate 16. More specifically, imaging units 60a and 60b may be employed to determine a center location of substrate 16, as mentioned above with respect to FIGS. 5 and 6, with respect to any part of system 10, i.e., molds 26 and 226, dispensing units 48 and 248, or robot 68. As a result, a desired spatial relationship of substrate 16 with respect to any part of system 10 may be obtained, described further below.

Figure 17:
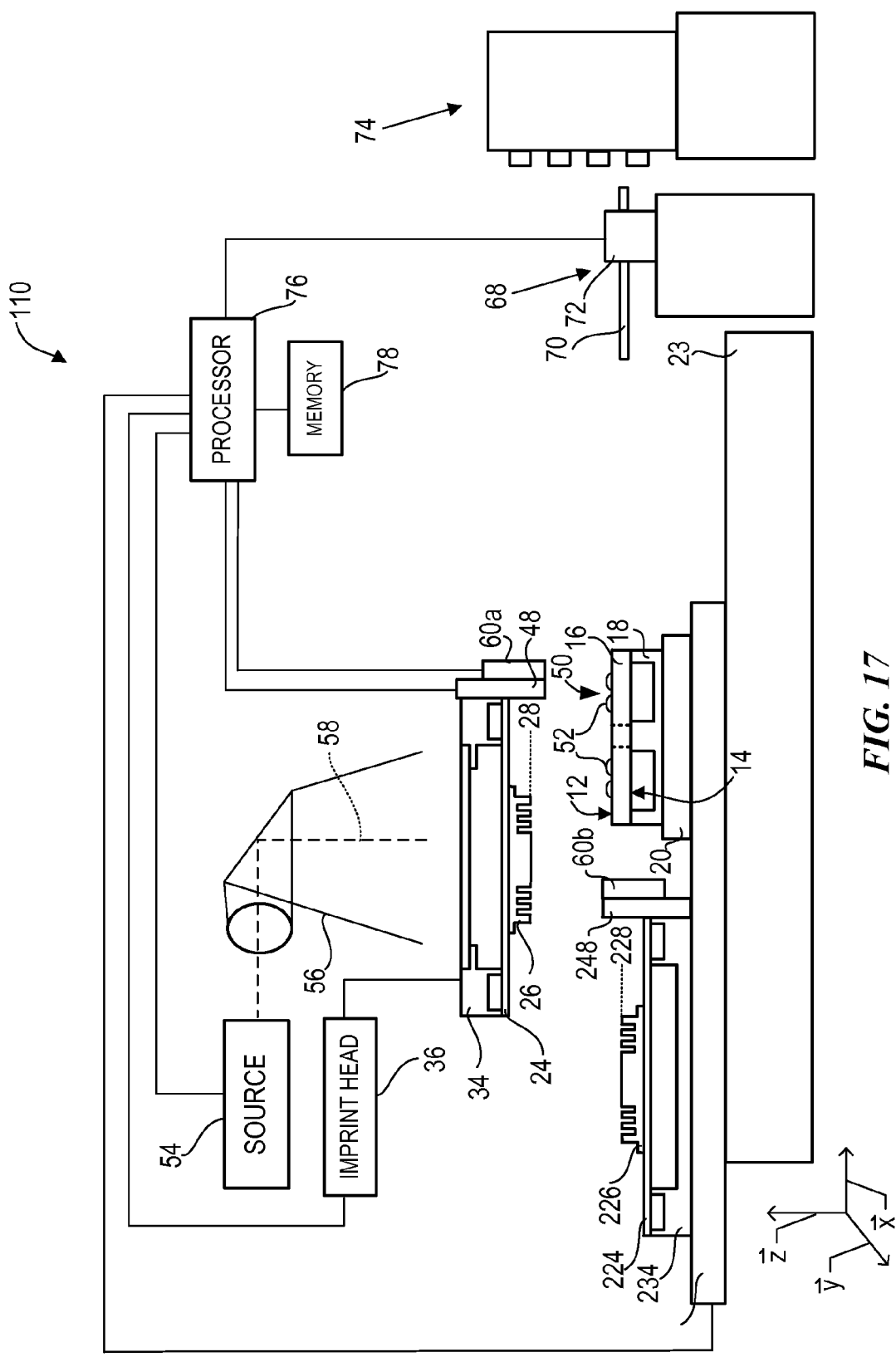
FIG. 17 is a side view of the system shown in FIG. 16, with the substrate having a material positioned on the first side thereof.

Referring to FIGS. 15 and 17, at step 304, first and second stages 20 and 22 may translate substrate 16 such that a desired position may be obtained between substrate 16 and fluid dispenser 48. As a result, fluid dispenser 48 may position polymeric fluid 50 upon first side 12 of substrate 16, as mentioned above.

Figure 18:
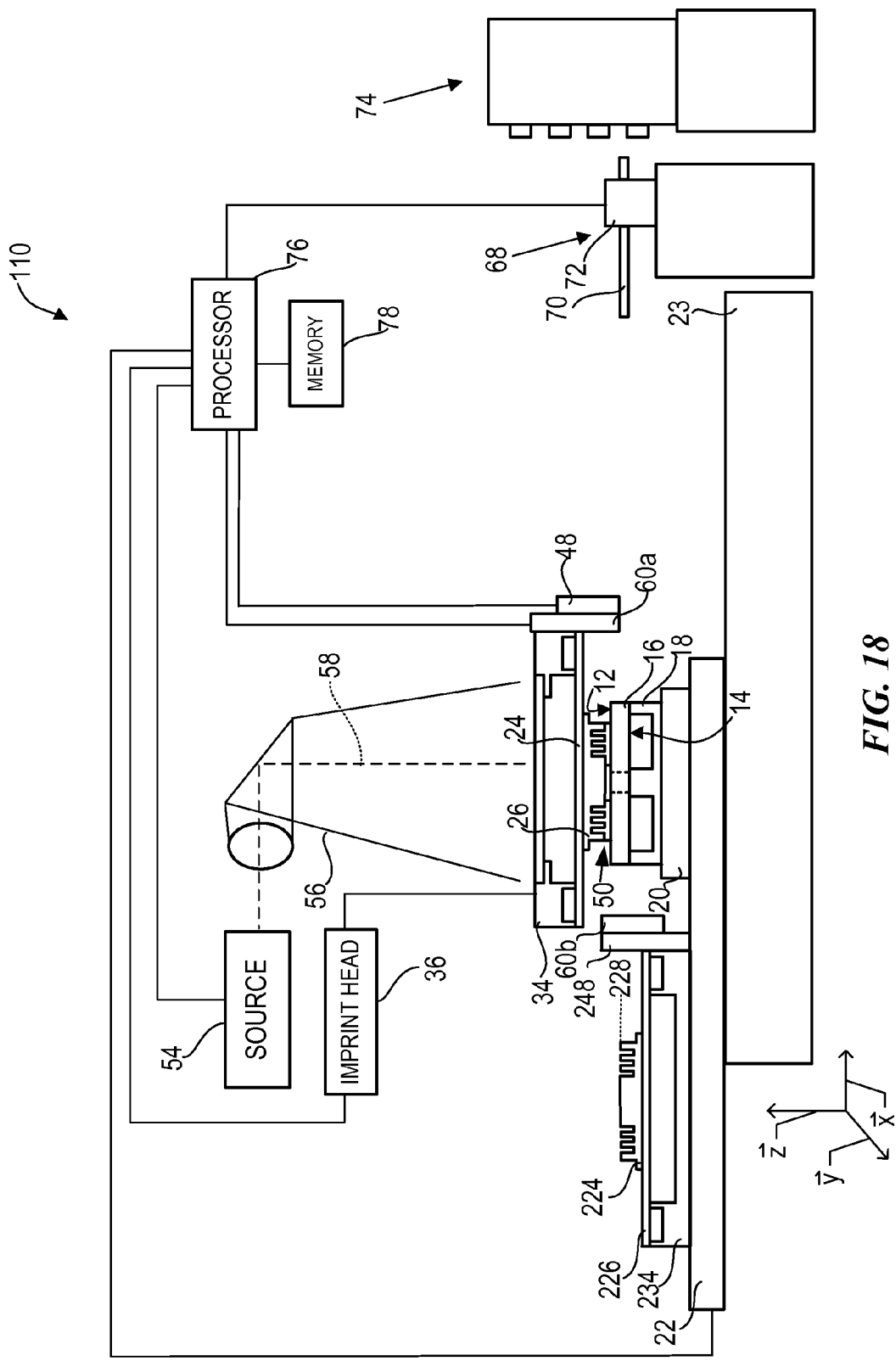
FIG. 18 is a side view of the system shown in FIG. 17, with the first template contacting the fluid positioned on the first side of the substrate.

Referring to FIGS. 15 and 18, at step 306, a desired position may be obtained between substrate 16 and mold 26. More specifically, first and second stages 20 and 22 and imprint head 36 may position substrate chuck 18 such that substrate 16 may be in superimposition with mold 26 and further polymeric material 50 positioned on first side 12 of substrate 16 fills the desired volume defined between substrate 16 and mold 26. At step 308, as mentioned above, polymeric material 50 positioned on first side 12 of substrate 16 may be solidified and/or cross-linked conforming to first side 12 of substrate 16 and patterning surface 28 of mold 26. At step 310, substrate 16 may be separated from substrate chuck 18 such that substrate 16 is coupled to mold 26.

Figure 19:
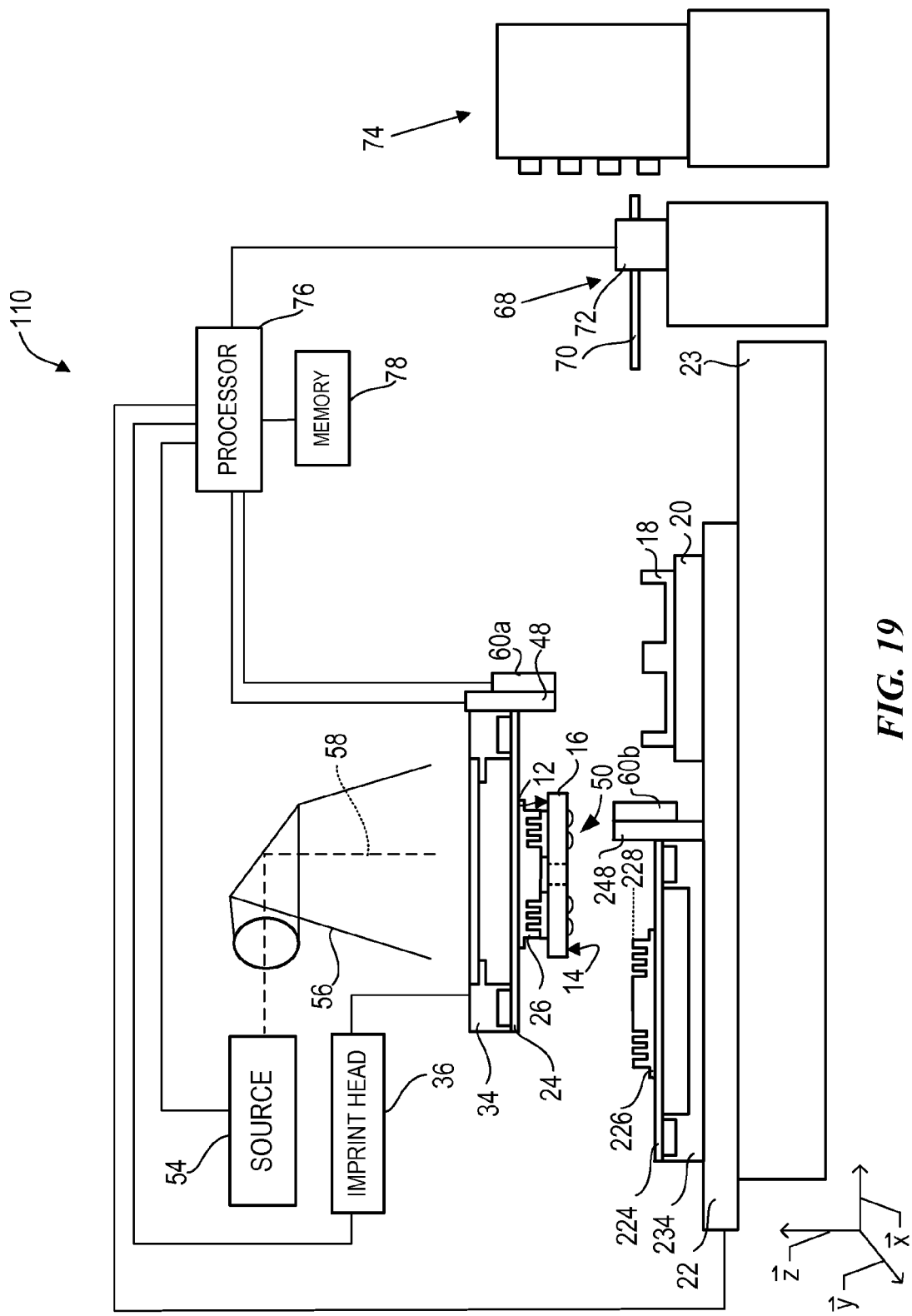
FIG. 19 is a side view of the system shown in FIG. 18, with the substrate being coupled to the first template and the substrate having a material positioned on the second side thereof.

Referring to FIGS. 15 and 19, at step 312, first stage 20, or in a further embodiment, first and second stages 20 and 22, may translate fluid dispenser 248 such that a desired position may be obtained between substrate 16 and fluid dispenser 248. As a result, fluid dispenser 248 may position polymeric fluid 50 upon second side 14 of substrate 16, analogous to that mentioned above with respect to first side 12 of substrate 16 shown in FIG. 17.

Figure 20:
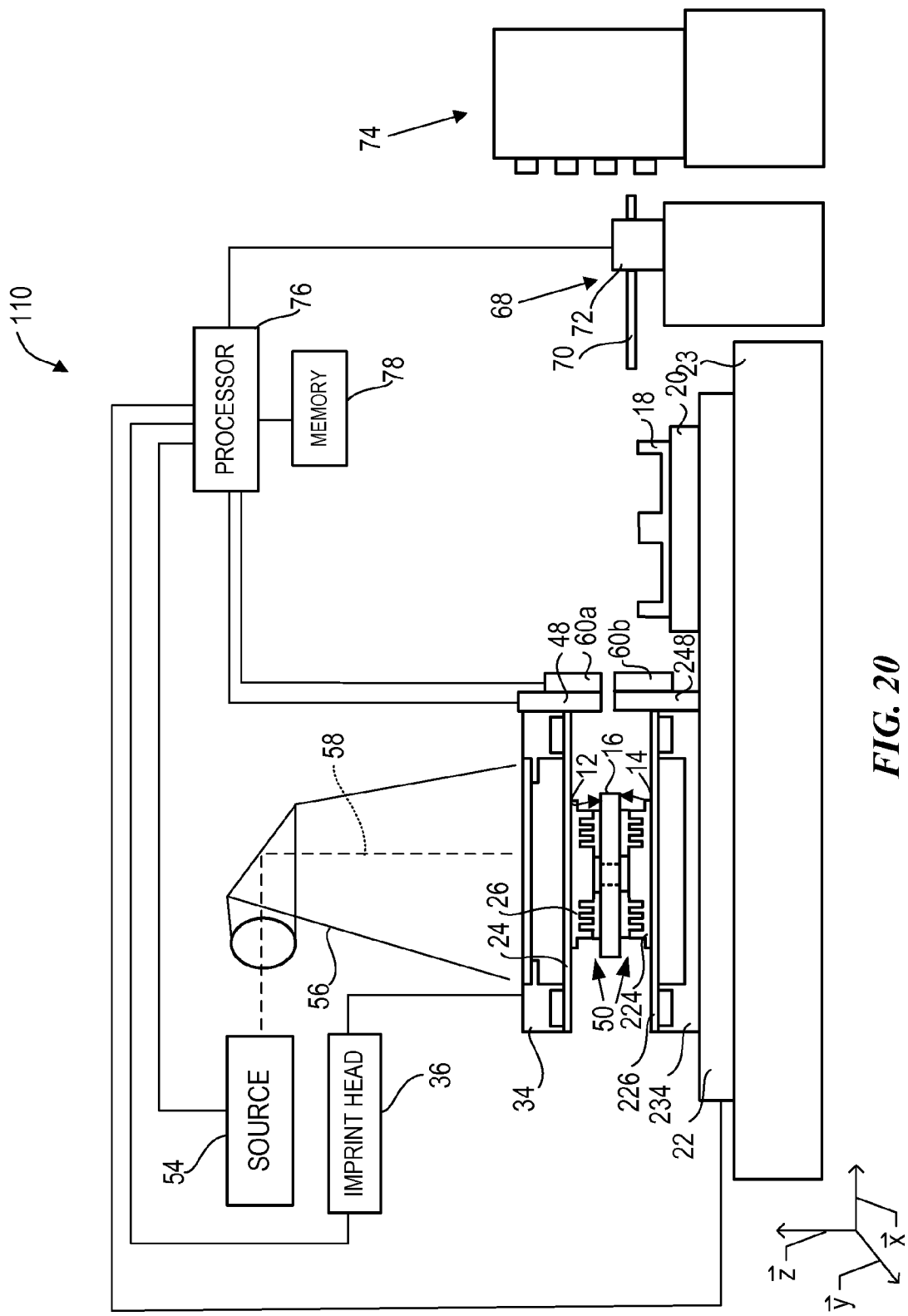
FIG. 20 is a side view of the system shown in FIG. 19, with the second template contacting the fluid positioned on the second side of the substrate.

Referring to FIGS. 15 and 20, at step 314, a desired position may be obtained between substrate 16 and mold 226. More specifically, second stage 22, or in a further embodiment, first and second stages 20 and 22, and imprint head 26 may position mold 226 to be in superimposition with substrate 16 with polymeric material 50 positioned on second side 14 of substrate 16 filling the desired volume defined between substrate 16 and mold 226. At step 316, polymeric material 50 positioned on second side 14 of substrate 16 may be solidified and/or cross-linked conforming to second side 14 of substrate 16 and patterning surface 228 of mold 226. In a further embodiment, step 308, mentioned above, may be omitted where substrate 16 substantially transparent to the actinic radiation mentioned above such that material 50 positioned on first and second sides 12 and 14 of substrate 16 may be solidified and/or cross-linked concurrently.

Figure 21:
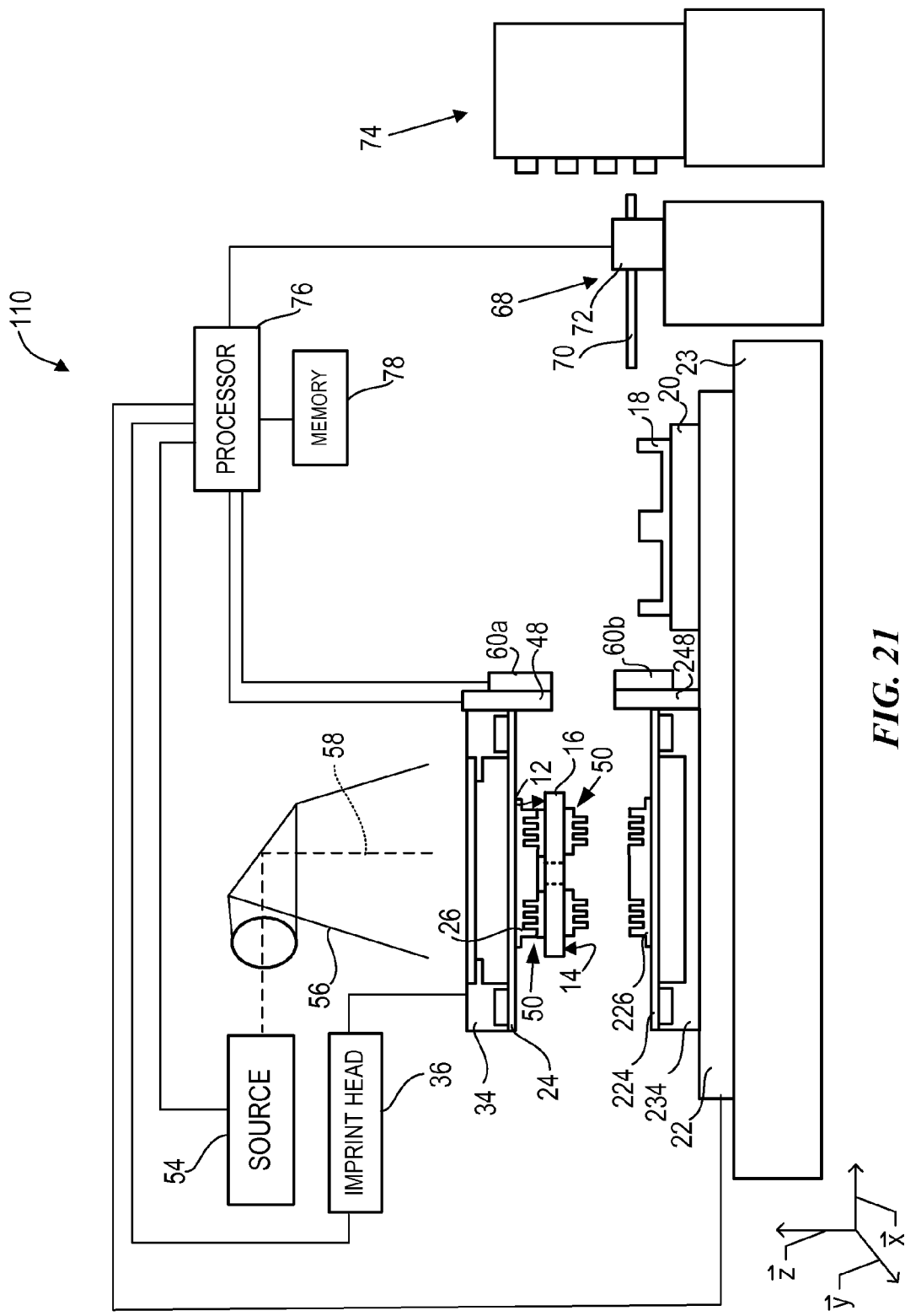
FIG. 21 is a side view of the system shown in FIG. 20, with the second template being spaced-apart from the substrate.

Referring to FIGS. 15 and 21, at step 318, mold 226 may be separated from polymeric material 50 positioned on second side 14 of substrate 16 such that substrate 16 remains coupled to mold 26. To facilitate separation of mold 226 from polymeric material 50, mold 226 may be bowed towards substrate 16 while concurrently imprint head 36 provides motion of mold 26 in a direction away from mold 226.

Figure 22:
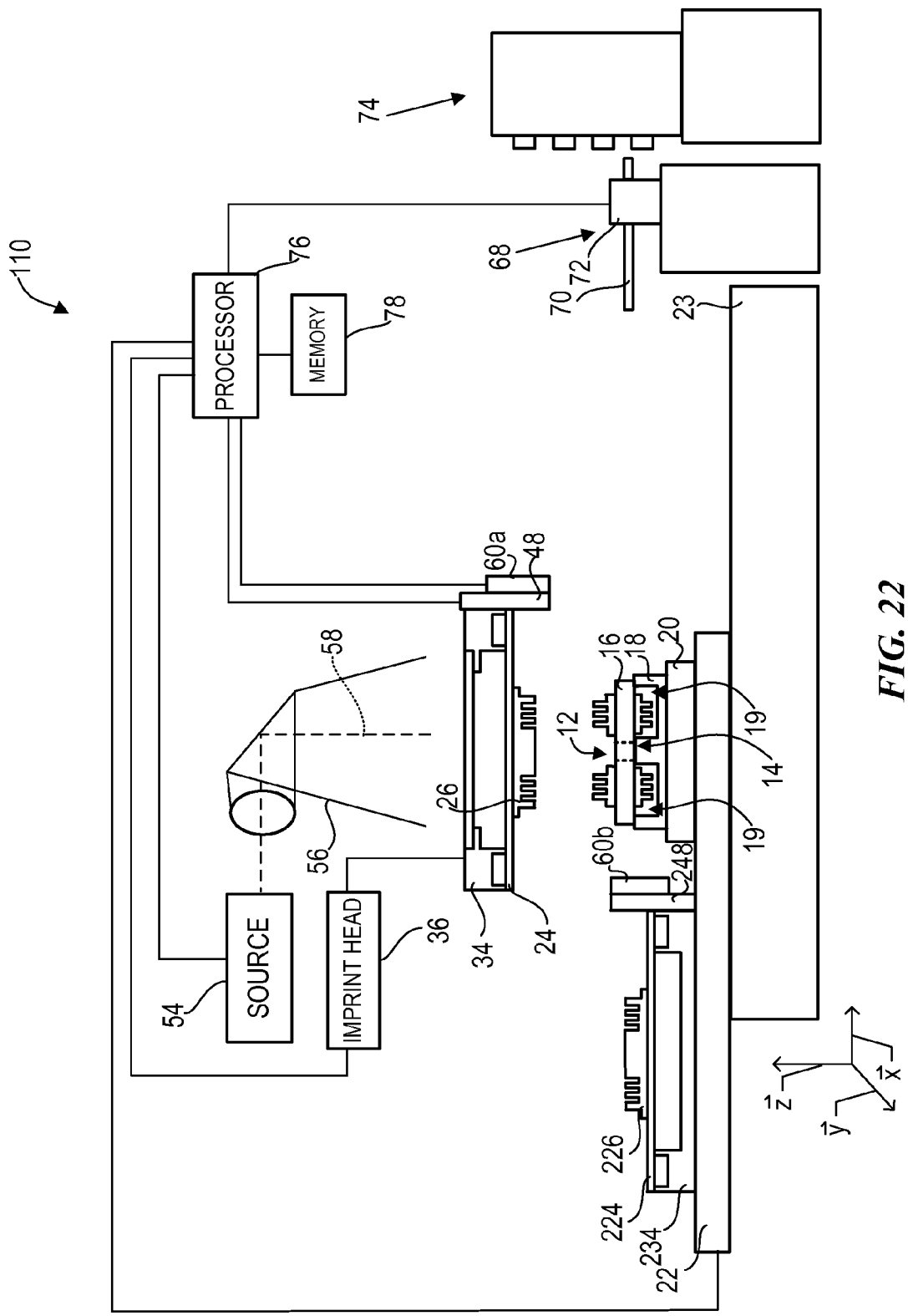
FIG. 22 is a side view of the system shown in FIG. 21, with the substrate being positioned on the substrate chuck having a pattern formed on the first and second sides thereof.

Referring to FIGS. 15 and 22, at step 320, first and second stage 20 and 22 and imprint head 36 may position substrate chuck 18 such that substrate chuck 18 may be in superimposition with substrate 16. At step 322, mold 26 may be separated from polymeric material 50 positioned on first side 12 of substrate 16 such that substrate 16 may be positioned upon substrate chuck 18. To facilitate separation of mold 26 from polymeric material 50, mold 26 may be bowed towards substrate 16 while concurrently imprint head 36 provides motion of mold 26 in a direction away from substrate 16. Polymeric material 50 positioned on second side 14 of substrate 16 may be positioned within cavity 19 of substrate chuck 18 to minimize, if not prevent, damage to polymeric material 50. At step 324, substrate 16 may be unloaded from substrate chuck 18 and robot 68 may position substrate 16 in substrate cassette 74.

In a further embodiment, fluid dispensers 48 and 248 may be positioned outside of system 110, with first and second sides 12 and 14 of substrate 16 having polymeric fluid 50 positioned thereon outside of system 110. Furthermore, it may be desired to remove polymeric material 50 from portions of substrate 16 in contact with robot 68 and/or substrate chuck 18.

Figure 23:
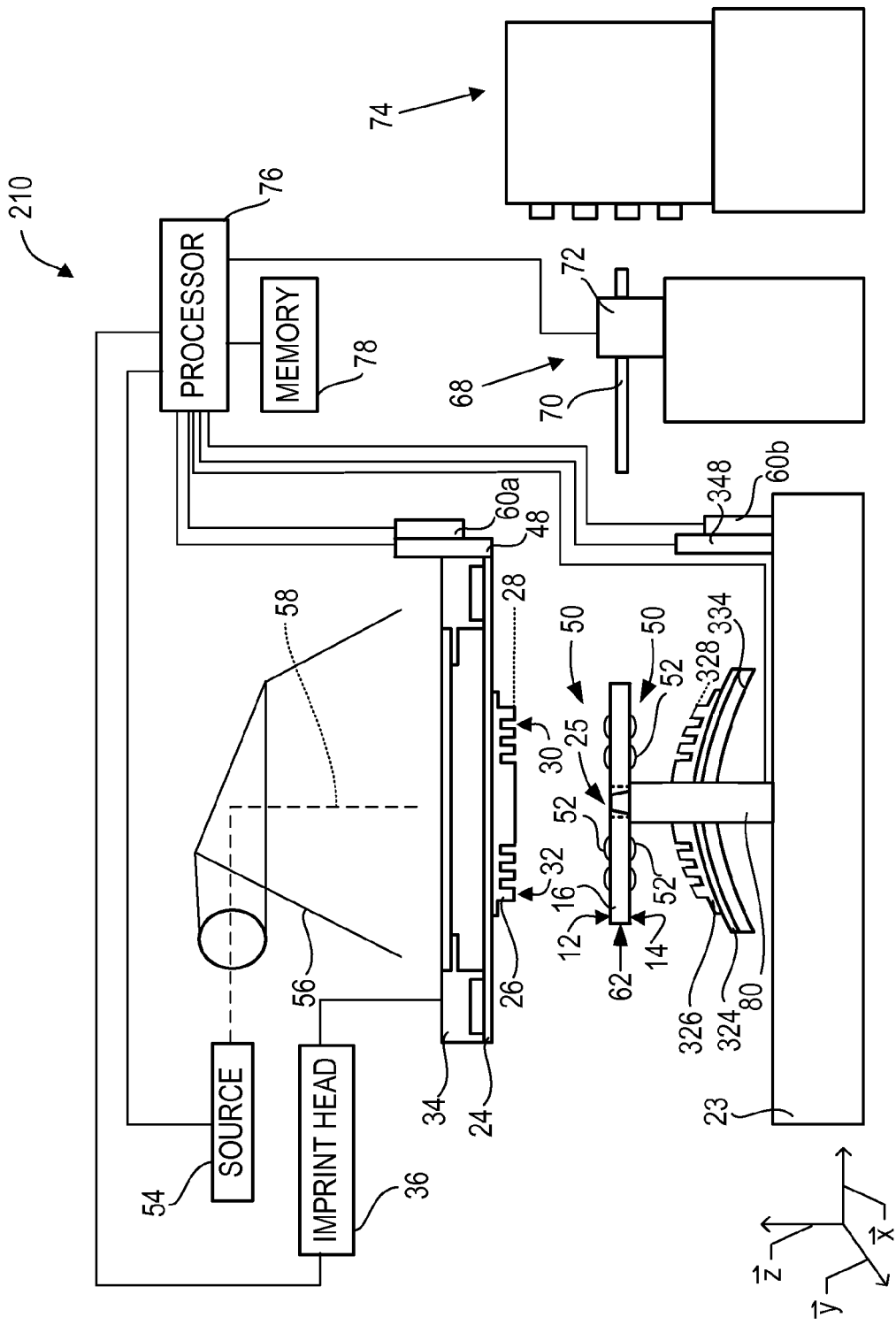
FIG. 23 is a side view of a lithographic system having a first template opposed a second template and a substrate, the substrate having first and second opposed sides, in a further embodiment.

Referring to FIG. 23, a third embodiment of system 10 is described, shown as system 210. System 210 may be analogous to that as system 10 described above with respect to FIGS. 1-7, however, system 210 may further comprise an additional patterning surface and a pin 80 to hold substrate 16, described further below.

System 210 further comprises a template 324 having a mold 326 extending therefrom towards template 24. Template 324 may be coupled to a template chuck 334. Template 324, mold 326, and template chuck 334 may be analogous to that of template 24, mold 26, and template chuck 34, respectively, described above with respect to FIG. 1. Mold 326 may have substantially the same patterning surface 328 as patterning surface 28 of mold 26; however, in a further embodiment, patterning surface 328 may differ from patterning surface 28. In a further embodiment, template chuck 324 may be a spherical chucking unit having a curvature in the range of 2 microns to 100 microns over an area of template chuck 324 in superimposition with mold 326. Pin 80 may provide motion of template 324 and mold 326 in the first axis and second axis, as mentioned above with respect to FIG. 1. Further pin 80 may provide motion along a third axis orthogonal to the first and second axis, i.e. along the x axis. In an example, pin 80 may provide motion about the x and y axis of approximately 50-200 microns and along the z axis of approximately 2 millimeters.

System 210 further comprises a fluid dispenser 348, with fluid dispenser 348 being analogous to fluid dispenser 48 mentioned above with respect to FIG. 1. Fluid dispenser 348 and imaging unit 60b are shown coupled to base 23; however, fluid dispenser 348 and imaging unit 60b may be coupled to any part of system 210. Control of fluid dispenser 348 may be regulated by processor 76 that is in data communication with fluid dispenser 348.

Figure 24:
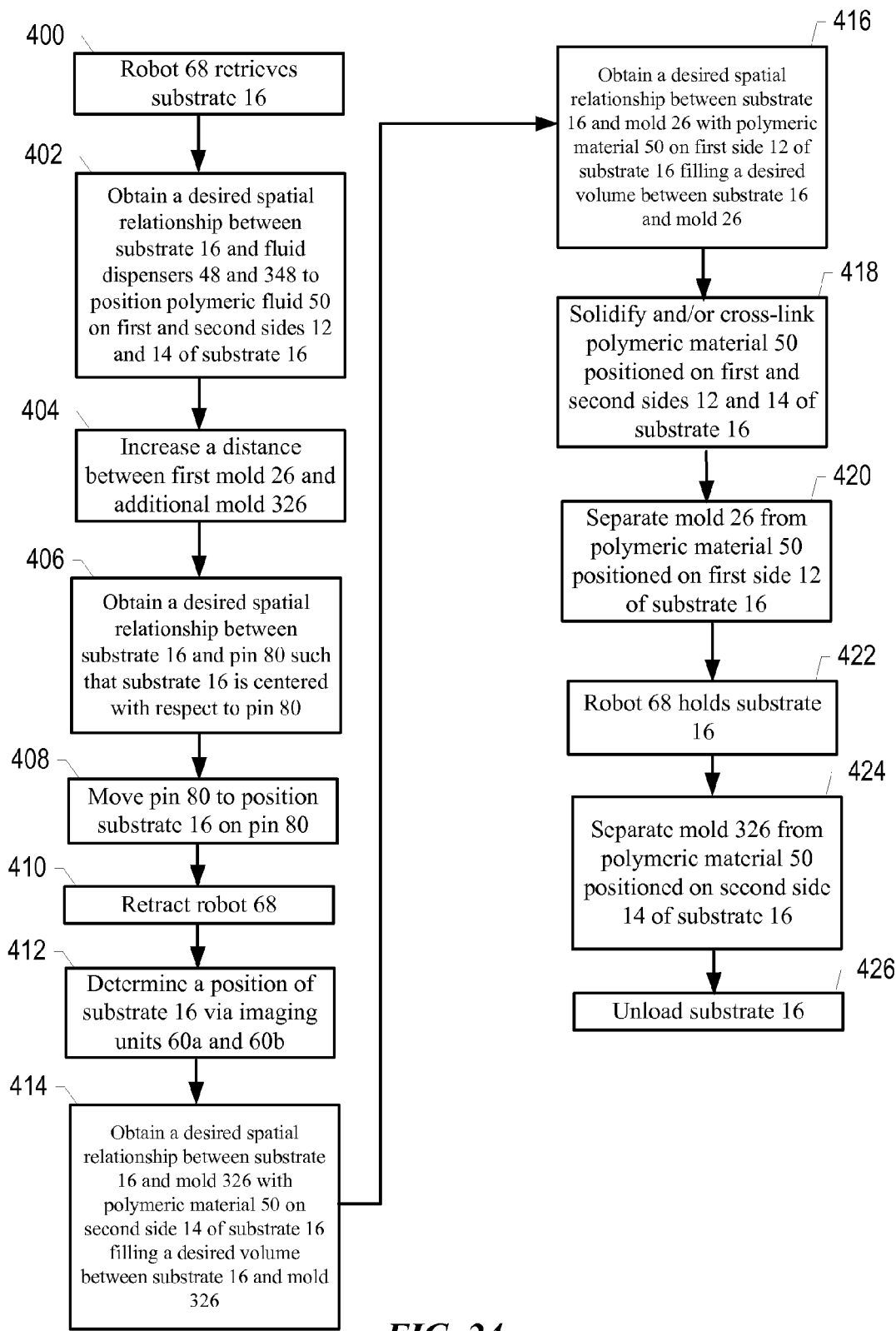
FIG. 24 is a flow diagram showing a method of patterning the first and second opposed sides of the substrate shown in FIG. 23, in a further embodiment.
Figure 25:
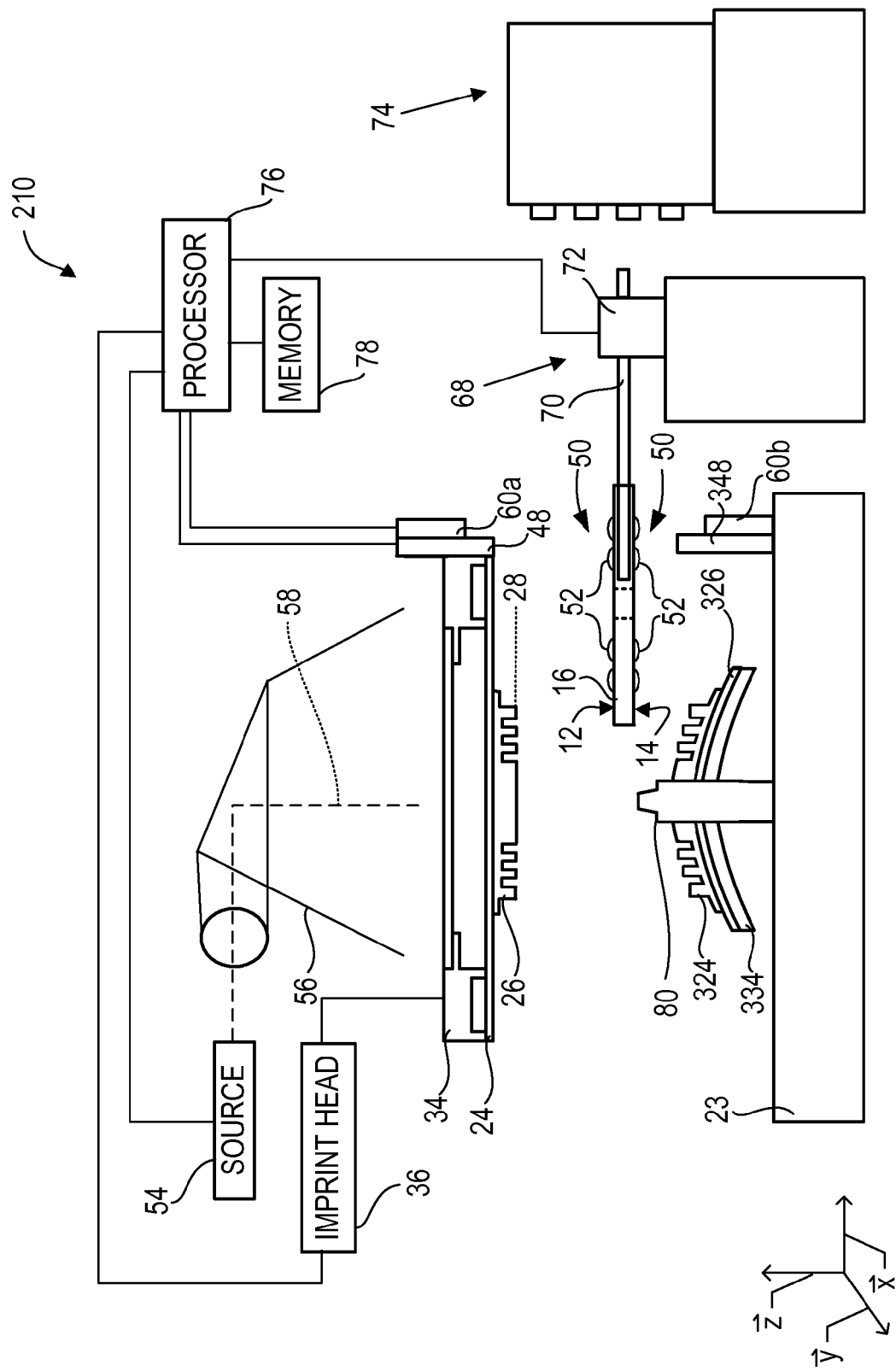
FIG. 25 is a side view of the system shown in FIG. 23, with the substrate having a material positioned on the first and second sides thereof.

Referring to FIGS. 24 and 25, a third embodiment of a method and a system of forming a pattern on first and second sides 12 and 14 of substrate 16 are shown. At step 400, robot 68 may retrieve substrate 16 from substrate cassette 74 with robot 68 holding substrate 16. At step 402, robot 68 may position substrate 16 such that a desired spatial relationship between substrate 16 and fluid dispensers 48 and 348 may be obtained to position polymeric fluid upon substrate 16. More specifically, fluid dispenser 48 may position polymeric fluid 50 on first side 12 of substrate 16 and fluid dispenser 348 may position polymeric fluid 50 on second side 14 of substrate 16. In a further embodiment, fluid dispensers 48 and 348 may be positioned outside of system 210, with first and second sides 12 and 14 of substrate 16 having polymeric fluid 50 positioned thereon outside of system 210. At step 404, a distance between mold 26 and mold 326 may be increased such that substrate 16 may be positioned between mold 26 and mold 326. Please note for simplicity of illustration, coupling between processor 76 and imaging unit 60b, pin 80, and fluid dispenser 348 is not shown.

Figure 26:
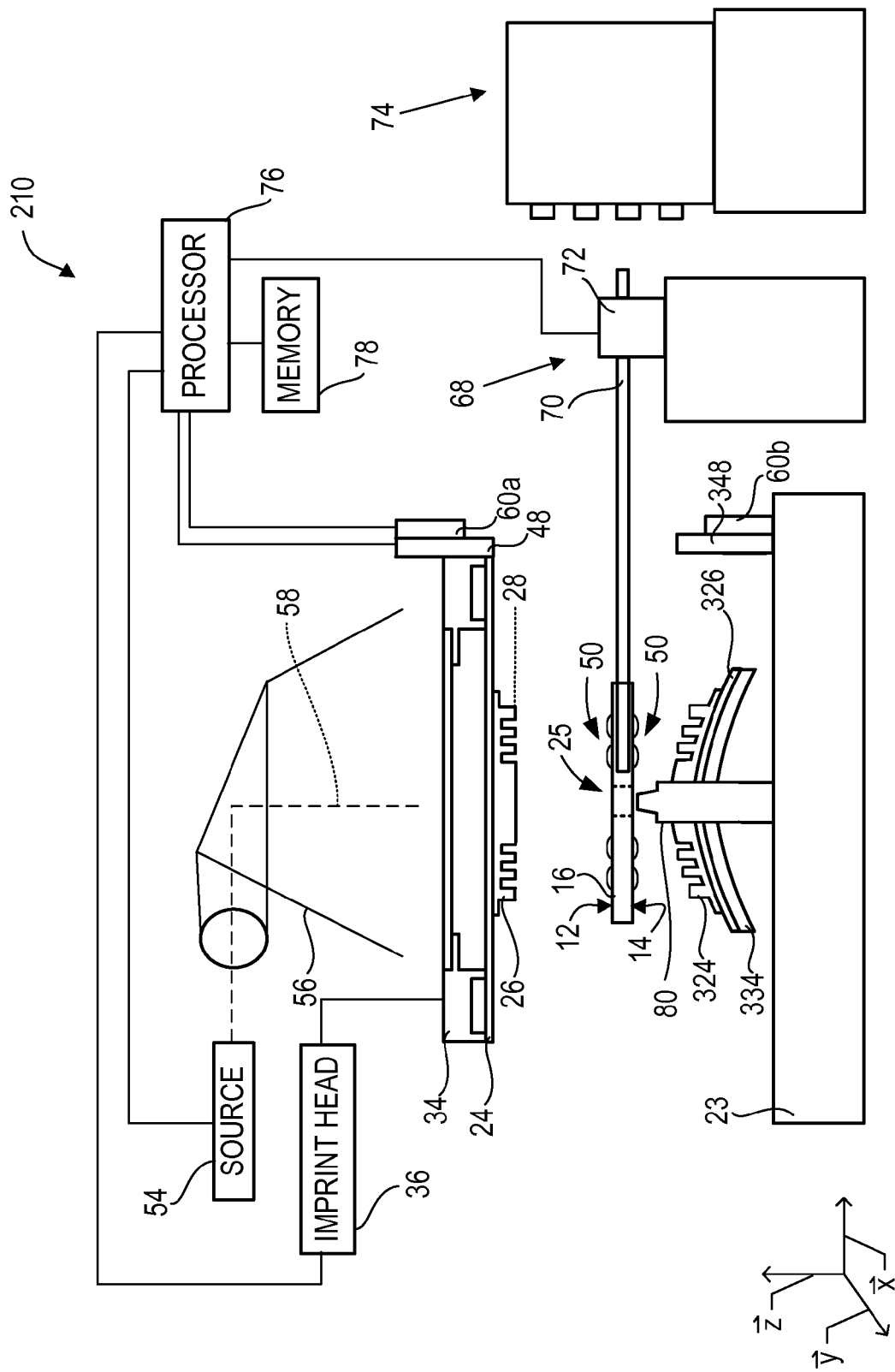
FIG. 26 is a side view of the system shown in FIG. 25, the substrate being in a desired spatial relationship with a pin.

Referring to FIGS. 24 and 26, at step 406, robot 68 may translate substrate 16 and pin 80 may translate such that a desired spatial relationship between substrate 16 and pin 80 may be obtained. As a result, substrate 16 may be centered with respect to pin 80. More specifically, throughway 25 may be in superimposition with pin 80. However, in a further embodiment, any desired spatial relationship between substrate 16 and pin 80 may be obtained.

Figure 27:
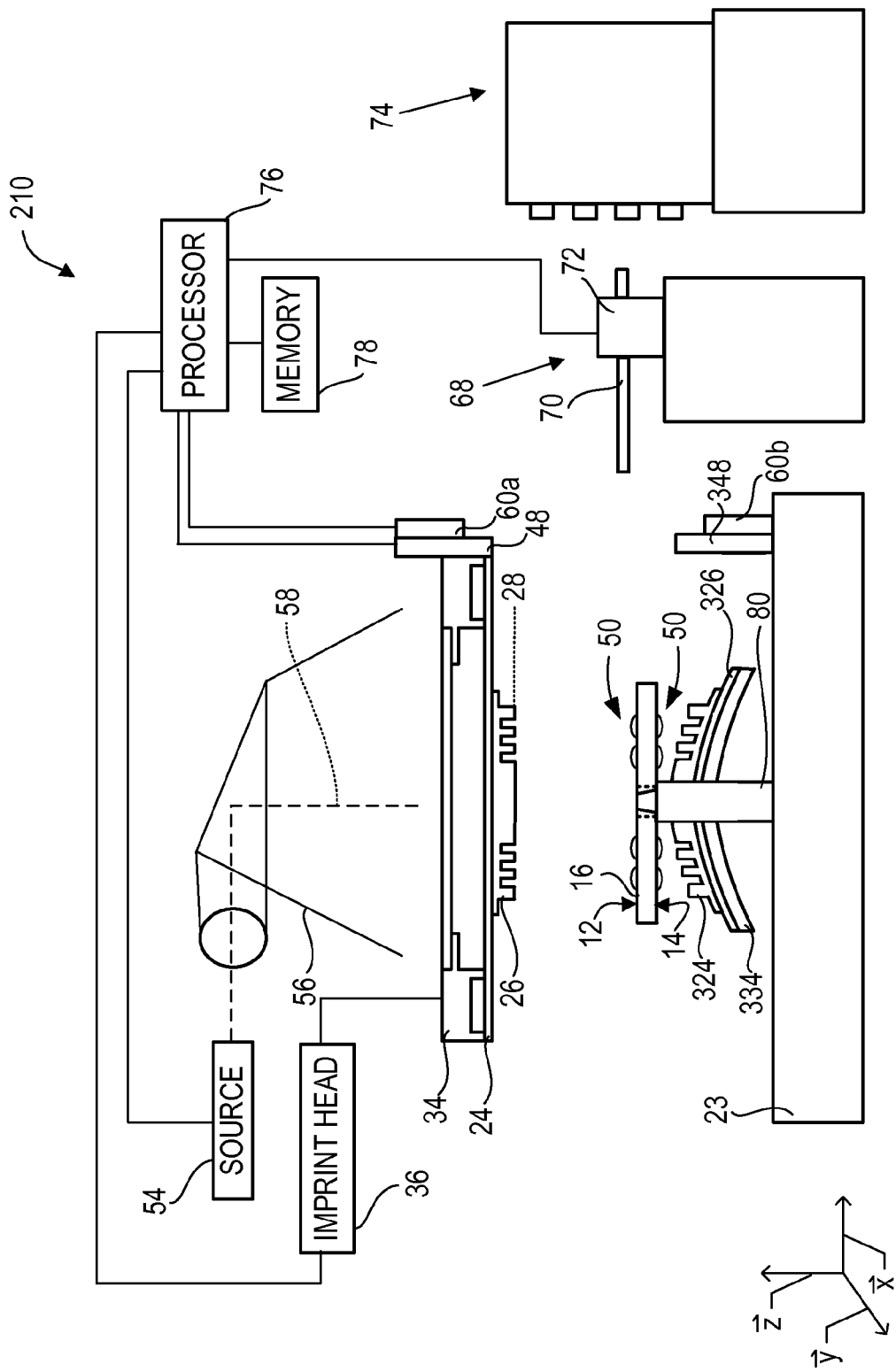
FIG. 27 is a side view of the system shown in FIG. 26, the substrate being positioned on the pin.

Referring to FIGS. 24 and 27, at step 408, pin 80 may translate along the z axis such that substrate 16 may be positioned upon pin 80. At step 410, robot 68 may be retracted from holding substrate 16. More specifically, arm 70 of robot 68 may be retracted such that end effecter 73, shown in FIG. 7, is not coupled to substrate 16. At step 412, imaging unit 60a may determine a position of substrate 16. More specifically, imaging unit 60a may be employed to determine a center location of substrate 16, as mentioned above with respect to FIGS. 5 and 6, with respect to any part of system 10, i.e., mold 26, mold 326, or robot 68. As a result, a desired spatial relationship of substrate 16 with respect to any part of system 10 may be obtained, described further below.

Figure 28:
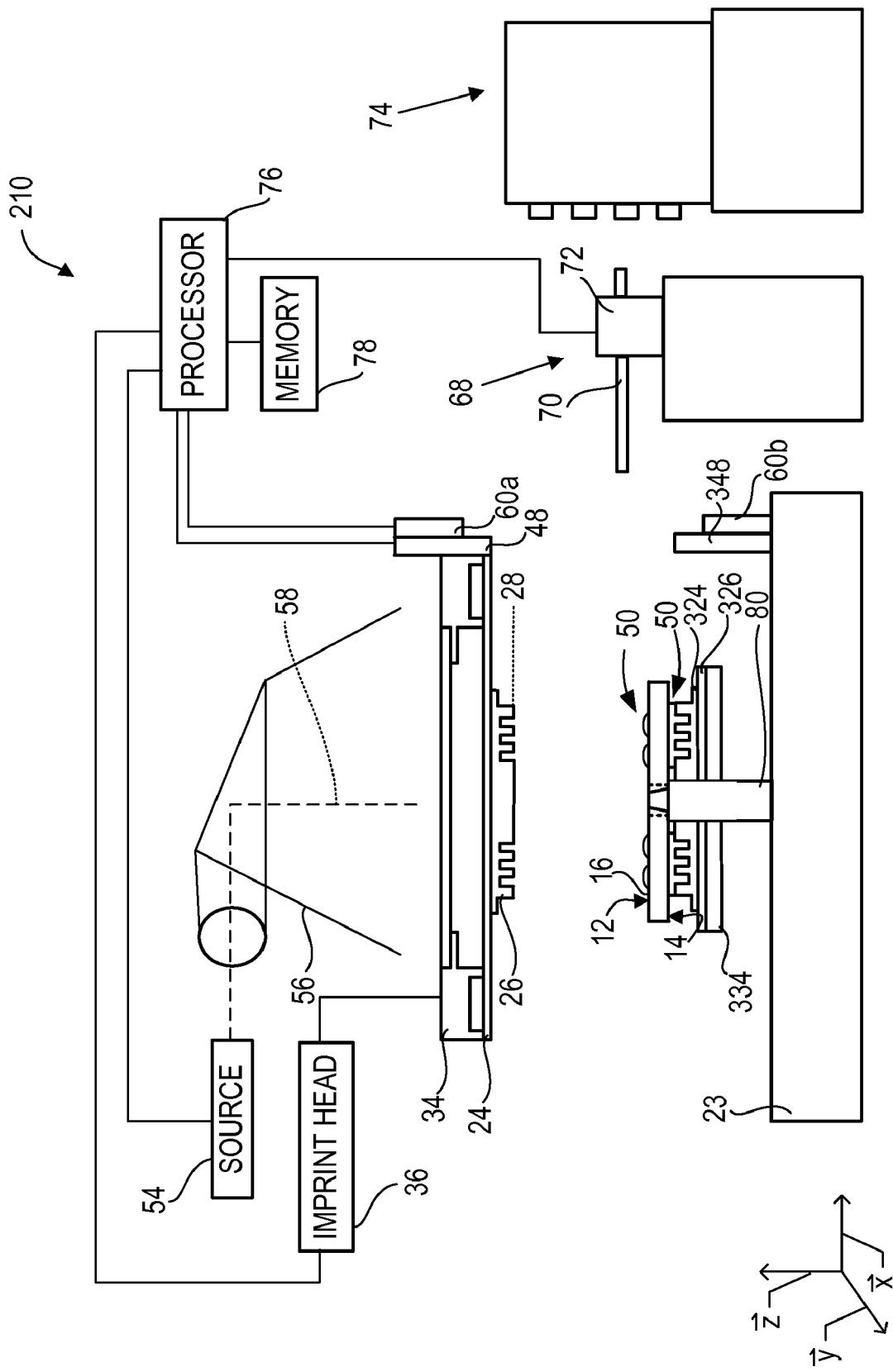
FIG. 28 is a side view of the system shown in FIG. 27, with the second template contacting the fluid positioned on the second side of the substrate.

Referring to FIGS. 24 and 28, at step 414, a desired position may be obtained between substrate 16 and mold 326. More specifically, pin 80 and chuck 334 may position substrate 16 and mold 326 such that substrate 16 may be in superimposition with mold 326 and further polymeric material 50 positioned on second side 14 of substrate 16 fills the desired volume defined between substrate 16 and mold 326.

Figure 29:
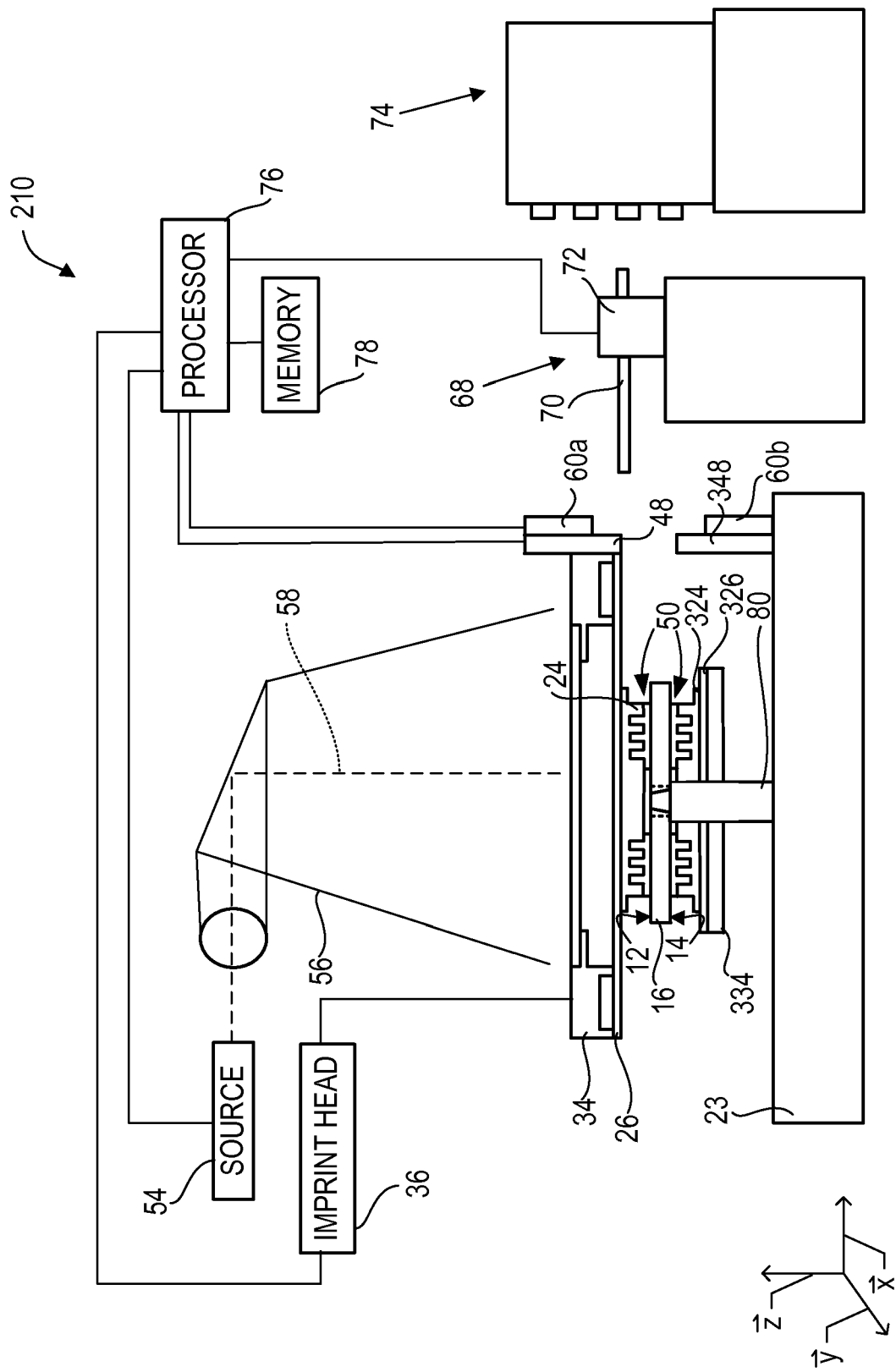
FIG. 29 is a side view of the system shown in FIG. 28, with the first template contacting the fluid positioned on the first side of the substrate.

Referring to FIGS. 24 and 29, at step 416, a desired position may be obtained between substrate 16 and mold 26. More specifically, pin 80 and imprint head 36 may position substrate 16 and mold 26 such that substrate 16 may be in superimposition with mold 26 and further polymeric material 50 positioned on first side 12 of substrate 16 fills the desired volume defined between substrate 16 and mold 26. At step 418, as mentioned above, polymeric material 50 positioned on first side 12 of substrate 16 may be solidified and/or cross-linked conforming to first side 12 of substrate 16 and patterning surface 28 of mold 26 and polymeric material 50 positioned on second side 14 of substrate 16 may be solidified and/or cross-linked conforming to second side 14 of substrate 16 and patterning surface 328 of mold 326.

Figure 30:
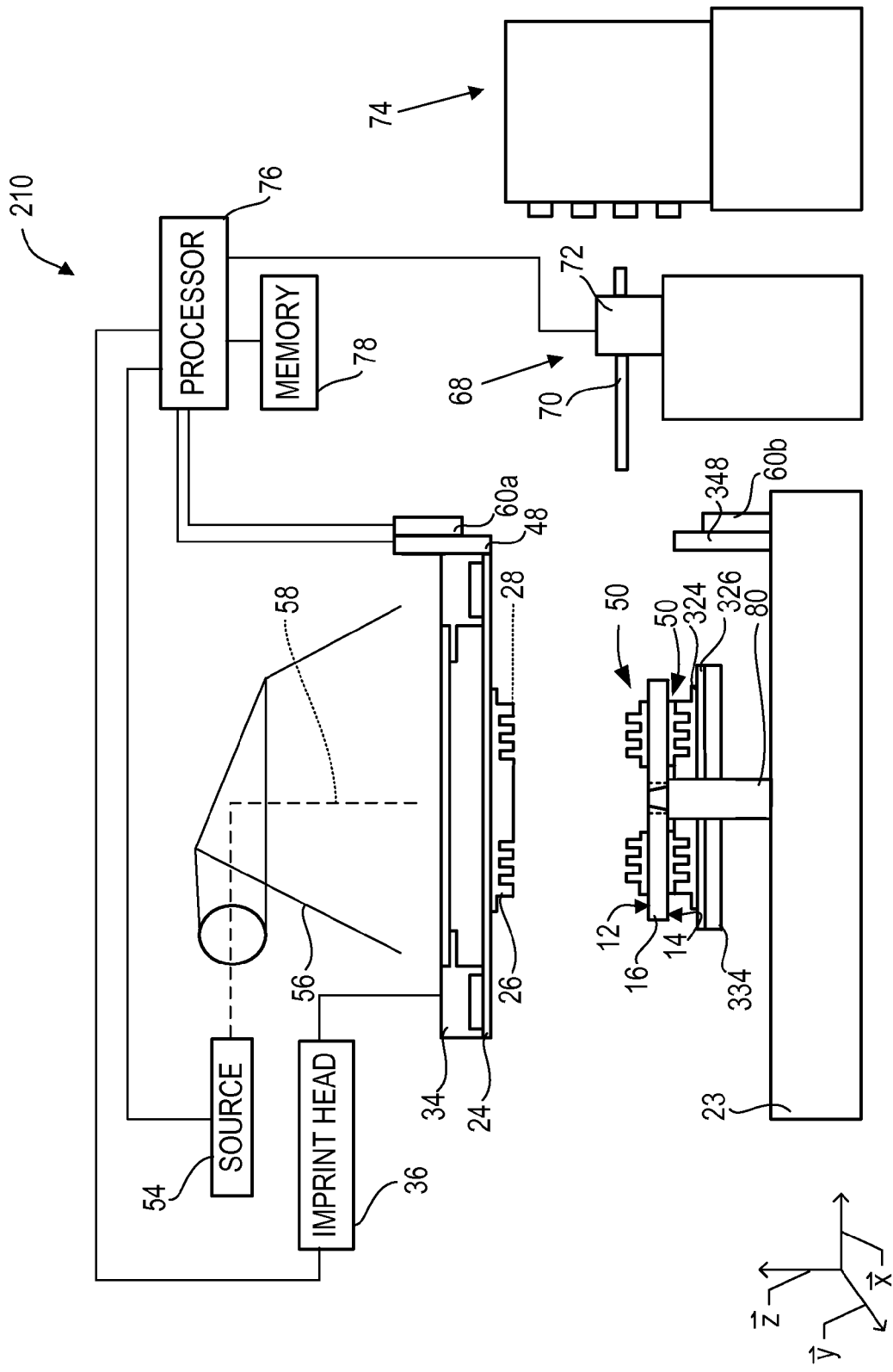
FIG. 30 is a side view of the system shown in FIG. 29, with the first template being spaced-apart from the substrate.

Referring to FIGS. 24 and 30, at step 420, mold 26 may be separated from polymeric material 50 positioned on first side 12 of substrate 16. Furthermore, it may be desired to remove polymeric material 50 from portions of substrate 16 in contact with robot 68 and/or pin 80.

Figure 31:
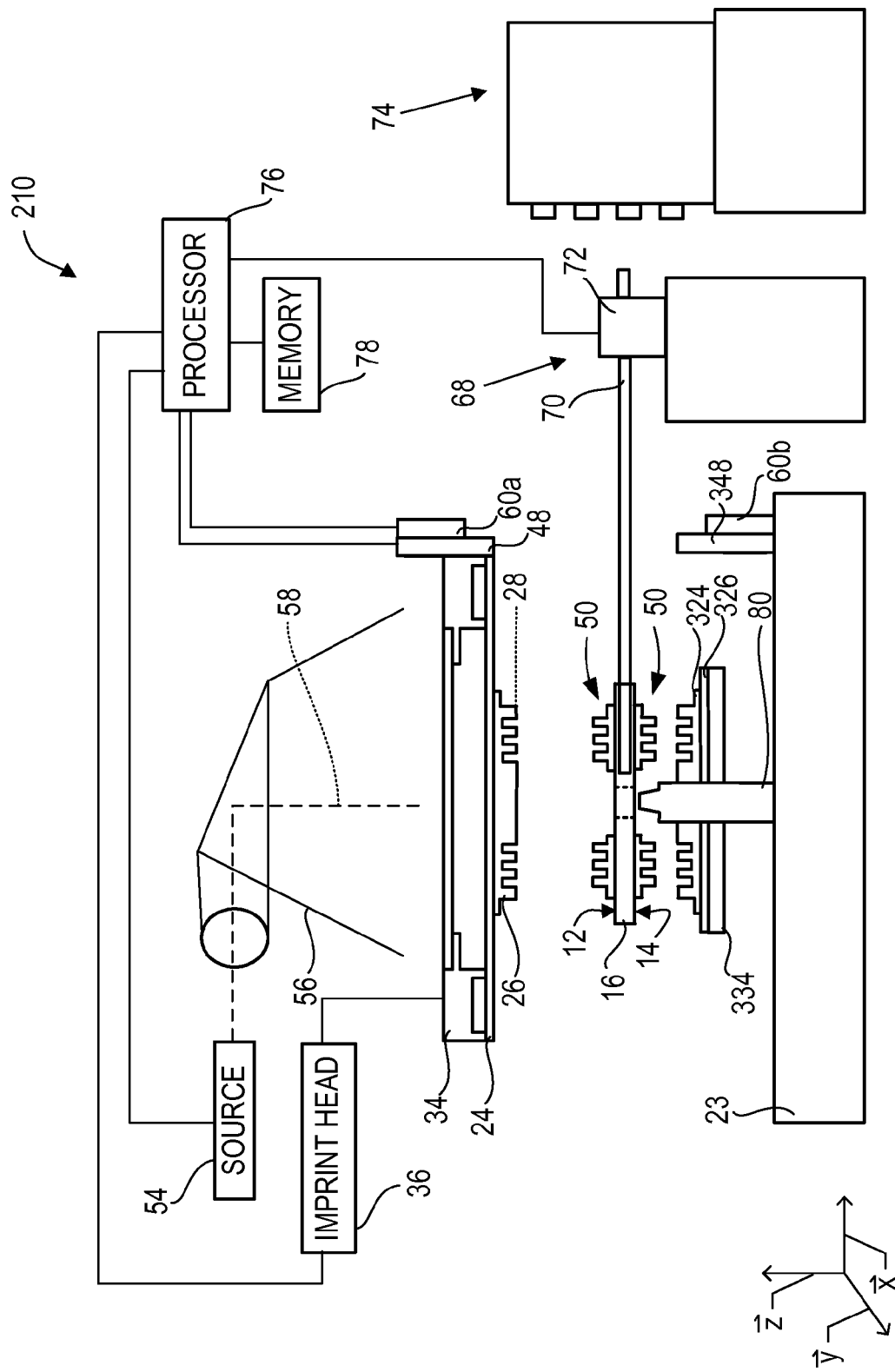
FIG. 31 is a side view of the system shown in FIG. 30, with the first and second templates being spaced-apart from the substrate.

Referring to FIGS. 24 and 31, at step 422, robot 68 may retrieve substrate 16 such that end effecter 73, shown in FIG. 7, of arm 70 holds substrate 16. At step 424, mold 326 may be separated from polymeric material 50 positioned on second side 14 of substrate 16 such that substrate 16 is coupled to robot 68. At step 426, substrate 16 may be unloaded from substrate chuck 18 and robot 68 may position substrate 16 in substrate cassette 74.

What is claimed is:

1. A system for patterning a substrate having first and second opposed sides, the system comprising:
   a substrate chuck coupled to the substrate, the substrate chuck having a first surface, the first surface having a cavity formed therein, wherein the cavity is constructed to isolate patterned layers formed on the substrate;
   a mold assembly; and
   a robot coupled to the substrate to alternatively place the substrate in first and second positions with respect to the mold assembly such that at a first position a first surface of the mold assembly contacts a material positioned on the first opposed side of the substrate, and subsequently at a second position the first surface of the mold assembly contacts a material positioned on the second opposed side of the substrate.

2. The system as recited in claim 1, further including first and second opposed fluid dispensers, the first fluid dispenser positioning the material on the first side of the substrate and the second fluid dispenser positioning the material on the second side of the substrate.

3. The system as recited in claim 1, further including an optical detection system to determine a spatial relationship between the mold assembly and the substrate.

4. The system as recited in claim 1, wherein the robot further flips the substrate 180 degrees with respect to the mold assembly.

5. The system as recited in claim 1, wherein the robot includes an arm coupled to a driving means, wherein the arm has an end effecter coupled to the substrate.

6. The system as recited in claim 5, wherein the end effecter contacts the substrates without contacting an area of the substrate having polymeric material positioned thereon.

7. The system as recited in claim 5, wherein the driving means provides motion about a first and a second axes.

8. The system as recited in claim 7, wherein the driving means provides rotation about an x axes to flip the substrate substantially 180degrees with respect to the mold assembly.

* * * * *